US012796261B2

(12) United States Patent
Park et al.

(10) Patent No.: US 12,796,261 B2

(45) Date of Patent: Nov. 10, 2026

(54) DISPLAY DEVICE

(71) Applicant: Samsung Display Co., Ltd., Yongin-si (KR)

(72) Inventors: Do Yeong Park, Yongin-si (KR); Kyung Bae Kim, Yongin-si (KR); Dong Woo Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 287 days.

(21) Appl. No.: 18/626,132

(22) Filed: Apr. 3, 2024

(65) Prior Publication Data

US 2025/0024727 A1 Jan. 16, 2025

(30) Foreign Application Priority Data

Jul. 10, 2023 (KR) ........................ 10-2023-0089308

(51) Int. Cl.

*H10K 50/19* (2023.01)
*H10K 59/131* (2023.01)
*H10K 59/35* (2023.01)

(52) U.S. Cl.

CPC ......... *H10K 59/1315* (2023.02); *H10K 50/19* (2023.02); *H10K 59/352* (2023.02)

(58) Field of Classification Search

CPC ............. H10K 2102/311; H10K 50/19; H10K 59/121; H10K 59/122; H10K 59/1315; H10K 59/352

See application file for complete search history.

(56) References Cited

U.S. PATENT DOCUMENTS

| | | | | | |
|---|---|---|---|---|---|
| 5,825,128 | A * | 10/1998 | Betsui | H01J 11/36 313/586 |
| 10,186,680 | B2 | 1/2019 | Lee | |
| 11,145,700 | B2 | 10/2021 | Choi et al. | |
| 11,765,941 | B2 * | 9/2023 | Ochi | H05B 33/02 257/40 |
| 2019/0088894 | A1 | 3/2019 | Park et al. | |
| 2022/0208952 | A1 | 6/2022 | Shin et al. | |

FOREIGN PATENT DOCUMENTS

| | | | |
|---|---|---|---|
| KR | 10-2021-0037950 | A | 4/2021 |
| KR | 10-2370355 | B1 | 3/2022 |
| KR | 10-2022-0096925 | A | 7/2022 |

* cited by examiner

*Primary Examiner* — Jaehwan Oh

(74) *Attorney, Agent, or Firm* — Womble Bond Dickinson (US) LLP

(57) ABSTRACT

A display device includes: sub-pixels on a base layer, each of the sub-pixels including a light emitting element including: a first electrode; a second electrode; and a light emitting structure electrically connected between the first electrode and the second electrode; and a separator protruding in a thickness direction of the base layer between the sub-pixels, and including separator structures spaced from each other in a plan view to define a separation area. The separation area includes one or more bending areas between the sub-pixels.

22 Claims, 18 Drawing Sheets

EL: EL1, EL2, EL3
SEP: SEP1, SEP2, SEP1-1, SEP1-2, SEP2-1, SEP2-2, MSEP
MSEP: MSEP1, MSEP2

EL: EL1, EL2, EL3
SEP: SEP1, SEP2, SEP3, SEP1-1, SEP1-2, SEP2-1, SEP2-2, MSEP
MSEP: MSEP1, MSEP2

DISPLAY DEVICE

CROSS-REFERENCE TO RELATED APPLICATION

The present application claims priority to and the benefit of Korean patent application No. 10-2023-0089308, filed on Jul. 10, 2023, in the Korean Intellectual Property Office, the entire content of which is incorporated by reference herein.

BACKGROUND

1. Field

Aspects of embodiments of the present disclosure relate to a display device.

2. Description of the Related Art

As information technology develops, the importance of display devices as a connection medium between a user and information is increasing. A display device may include a light emitting element, and may form sub-pixels adjacent to each other using the light emitting element.

An electrical signal supplied to each of the sub-pixels that are adjacent to each other may be distinguished. For example, a risk that electrical signals are crossed may occur due to a leakage current (e.g., lateral leakage) generated between the sub-pixels. Accordingly, a display device capable of reducing a risk such as the leakage current may be desired.

The above information disclosed in this Background section is for enhancement of understanding of the background of the present disclosure, and therefore, it may contain information that does not constitute prior art.

SUMMARY

A cathode electrode of a light emitting device may supply a common power to the sub-pixels. For example, the cathode electrodes of the sub-pixels may be electrically connected to each other. However, a separator structure may be used so that light emitting units forming the light emitting elements may be distinguished from each other between the sub-pixels that are adjacent to each other. The separator structure may physically separate the light emitting units from each other of the sub-pixels that are adjacent to each other. In this case, however, the separator structure may physically separate not only the light emitting units from each other, but also the cathode electrodes, which are formed as a common electrode, of the light emitting elements from each other. In this case, a risk such as a voltage drop may occur in the entire or substantially the entire area where the sub-pixels are disposed.

One or more embodiments of the present disclosure are directed to a display device having improved display quality by reducing a risk due to a leakage current or the like.

One or more embodiments of the present disclosure are directed to a display device in which a risk such as a voltage drop may be reduced by including a cathode electrode structure.

According to one or more embodiments of the present disclosure, a display device includes: sub-pixels on a base layer, each of the sub-pixels including a light emitting element including: a first electrode; a second electrode; and a light emitting structure electrically connected between the first electrode and the second electrode; and a separator protruding in a thickness direction of the base layer between the sub-pixels, and including separator structures spaced from each other in a plan view to define a separation area. The separation area includes one or more bending areas between the sub-pixels.

In an embodiment, the display device may further include a light emitting connection part including the same material as that of the light emitting structure, and including one or more light emitting bending portions. The first electrode may include a (1-1)-th electrode and a (1-2)-th electrode. The light emitting structure may include a first light emitting structure electrically connected to the (1-1)-th electrode, and a second light emitting structure electrically connected to the (1-2)-th electrode. The first light emitting structure and the second light emitting structure may be electrically connected to each other by the light emitting connection part, and the separator may surround at least a portion of each of the first light emitting structure, the second light emitting structure, and the light emitting connection part. The separator may include a first separator and a second separator located between the first light emitting structure and the second light emitting structure, and spaced from each other in a direction in which the first light emitting structure and the second light emitting structure are spaced from each other.

In an embodiment, the separator may further include an intermediate connection separator connected to at least one of the first separator or the second separator, and at least a portion of each of the first separator and the second separator may extend in a direction different from the direction in which the first light emitting structure and the second light emitting structure are spaced from each other.

In an embodiment, the intermediate connection separator may include a first intermediate connection separator and a second intermediate connection separator. The first intermediate connection separator may be spaced from the second separator, and may be directly connected to the first separator. The second intermediate connection separator may be spaced from the first separator, and may be directly connected to the second separator.

In an embodiment, the display device may further include a connection electrode including the same material as that of the second electrode, and the second electrode may include a (2-1)-th electrode and a (2-2)-th electrode. The connection electrode may electrically connect the (2-1)-th electrode and the (2-2)-th electrode to each other, and may include one or more electrode bending portions.

In an embodiment, the light emitting connection part may define a light emitting connection path electrically connected between the first light emitting structure and the second light emitting structure.

In an embodiment, the light emitting connection path may include: a first path between the second intermediate connection separator and the first separator; a second path between the first separator and the second separator; and a third path between the second separator and the first intermediate connection separator.

In an embodiment, the sub-pixels may include a first sub-pixel configured to emit a first color, a second sub-pixel configured to emit a second color, and a third sub-pixel configured to emit a third color. The first light emitting structure may be in the first sub-pixel, the second light emitting structure may be in the second sub-pixel, and the light emitting structure may further include a third light emitting structure in the third sub-pixel. The separator may include a (1-1)-th adjacent separator and a (1-2)-th adjacent separator located between the first light emitting structure and the third light emitting structure, and spaced from each other in a direction in which the first light emitting structure and the third light emitting structure are spaced from each other. The second intermediate connection separator may be adjacent to the first sub-pixel, the second sub-pixel, and the third sub-pixel in a plan view, may be spaced from the (1-1)-th adjacent separator, and may be directly connected to the (1-2)-th adjacent separator.

In an embodiment, the separator may include a (2-1)-th separator and a (2-2)-th separator located between the second light emitting structure and the third light emitting structure, and spaced from each other in a direction in which the second light emitting structure and the third light emitting structure are spaced from each other. The second intermediate connection separator may be spaced from the (2-1)-th separator, and may be directly connected to the (2-2)-th separator.

In an embodiment, the sub-pixels may have a quadrangular shape or a hexagonal shape in a plan view.

In an embodiment, the first light emitting structure, the second light emitting structure, and the third light emitting structure may be electrically connected to each other, and a length of the light emitting connection path may be greater than a distance in which the first light emitting structure and the second light emitting structure are spaced from each other.

In an embodiment, the display device may further include: a separation electrode including the same material as that of the second electrode, and including a first separation electrode and a second separation electrode; and a light emitting separation part including the same material as that of the light emitting structure, and including a first light emitting separation part and a second light emitting separation part. The first separation electrode may be located between the (2-1)-th electrode and the connection electrode, and the second separation electrode may be located between the connection electrode and the (2-2)-th electrode. The first light emitting separation part may be located between the first light emitting structure and the light emitting connection part, and the second light emitting separation part may be located between the light emitting connection part and the second light emitting structure.

In an embodiment, the first light emitting separation part may be located between the first separator and the first separation electrode, and the second light emitting separation part may be located between the second separator and the second separation electrode.

In an embodiment, the separator may further include a third separator spaced from the first separator and the second separator along a direction in which the first separator and the second separator are spaced from each other.

In an embodiment, a height of the separator may be 1000 Å to 4000 Å, and the first separator and the second separator may be spaced from each other by 0.3 μm to 0.4 μm.

In an embodiment, the first separator and the second separator may have different heights from each other.

In an embodiment, the display device may further include a pixel defining layer between the (1-1)-th electrode and the (1-2)-th electrode, the separator may be on the pixel defining layer, and the light emitting structure may include a hole injection layer, a hole transport layer, a light emitting layer, an electron transport layer, and an electron injection layer.

In an embodiment, each of the first separator and the second separator may include a body portion, and a protrusion portion on the body portion. The separator may further include a residual separator on the pixel defining layer, and located between the first separator and the second separator. The residual separator may have a height lower than that of the first separator and the second separator, and the residual separator may include the same material as that of the body portion.

In an embodiment, the residual separator may include a material different from that of a layer located at an uppermost portion of the pixel defining layer.

In an embodiment, the display device may further include: a display area, and a non-display area surrounding at least a portion of the display area; a pixel-circuit layer on the base layer, and including a pixel circuit electrically connected to the first electrode; a first power line on the base layer, and electrically connected to the pixel circuit; and a second power line on the base layer, and in the non-display area, the second power line being electrically connected to the second electrode. The second electrode and the second power line may be electrically connected to each other in an area adjacent to the display area and the non-display area.

According to one or more embodiments of the present disclosure, a display device includes: sub-pixels on a base layer, and including a first sub-pixel and a second sub-pixel; and a connection electrode on the base layer. Each of the sub-pixels includes a light emitting element on the base layer, the light emitting element including a first electrode, a second electrode, and a light emitting structure electrically connected between the first electrode and the second electrode. The second electrode includes a (2-1)-th electrode in the first sub-pixel, and a (2-2)-th electrode in the second sub-pixel. The connection electrode is integral with the (2-1)-th electrode and the (2-2)-th electrode, electrically connects the (2-1)-th electrode and the (2-2)-th electrode to each other, and includes one or more electrode bending portions.

According to one or more embodiments of the present disclosure, a display device includes: sub-pixels on a base layer, and including a first sub-pixel and a second sub-pixel; and a light emitting connection part on the base layer. Each of the sub-pixels includes a light emitting element on the base layer, the light emitting element including a first electrode, a second electrode, and a light emitting structure electrically connected between the first electrode and the second electrode, and the light emitting structure includes a first light emitting structure in the first sub-pixel, and a second light emitting structure in the second sub-pixel. The light emitting connection part is integral with the first light emitting structure and the second light emitting structure to connect the first light emitting structure and the second light emitting structure to each other, and includes one or more light emitting bending portions.

According to one or more embodiments of the present disclosure, a display device having improved display quality may be provided by reducing a risk due to a leakage current or the like.

According to one or more embodiments of the present disclosure, a display device may be provided, in which a risk such as a voltage drop may be reduced by including a cathode electrode structure.

BRIEF DESCRIPTION OF THE DRAWINGS

The above and other aspects and features of the present disclosure will be more clearly understood from the following detailed description of the illustrative, non-limiting embodiments with reference to the accompanying drawings, in which.

DETAILED DESCRIPTION

Figure 1:
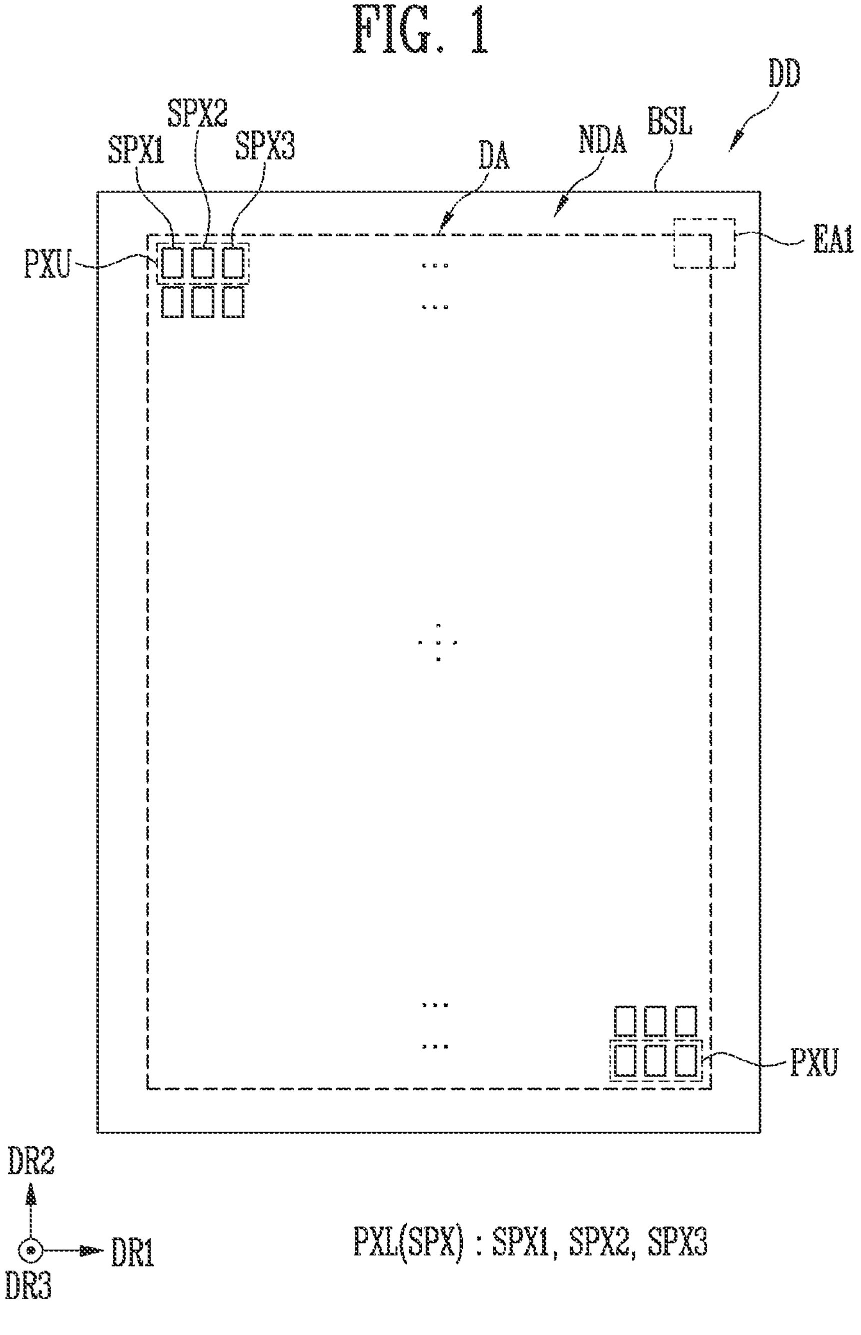
FIG. 1 is a schematic plan view illustrating a display device according to an embodiment.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes, thicknesses, and ratios of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a schematic plan view illustrating a display device according to an embodiment.

The display device DD is configured to emit light. The display device DD includes a light emitting element LD (e.g., see FIGS. 3 and 4). According to an embodiment, the display device DD may be provided in various suitable forms. For example, the display device DD may be applied to a smart phone, a notebook, a tablet personal computer (PC), a wearable device (e.g., a head-mounted device, a smart watch, smart glasses, and the like), a television, an infotainment system for a vehicle, and the like.

Referring to FIG. 1, the display device DD may include a base layer BSL, and a pixel PXL disposed on the base layer BSL. The display device DD may further include a driving circuit unit (e.g., a driving circuit, such as a scan driver and a data driver), lines, and pads for driving the pixel PXL.

The display device DD may include a display area DA and a non-display area NDA. The non-display area NDA may refer to an area other than the display area DA. The non-display area NDA may surround (e.g., around a periphery of) at least a portion of the display area DA.

The base layer BSL may form a base member of the display device DD. The base layer BSL may be a rigid or flexible substrate or film.

According to an embodiment, the base layer BSL may be a rigid substrate formed of glass or tempered glass, a flexible substrate (or a thin film) of a plastic or metal material, or at least one insulating layer. The base layer BSL may include a silicon wafer.

However, the material and/or physical property of the base layer BSL are/is not particularly limited thereto. According to an embodiment, the base layer BSL may be transparent or substantially transparent. Here, "transparent or substantially transparent" may mean that light may be transmitted at a level of one transmittance or more. In another embodiment, the base layer BSL may be translucent or opaque. In addition, the base layer BSL may include a reflective material according to an embodiment.

The display area DA may refer to an area where the pixel PXL is disposed. The non-display area NDA may refer to an area in which the pixel PXL is not disposed. The driving circuit unit, the lines, and the pads connected to the pixel PXL of the display area DA may be disposed in the non-display area NDA.

According to an embodiment, the pixel PXL (or sub-pixels SPX) may be arranged in various suitable structures. For example, the pixel PXL (or the sub-pixels SPX) may be arranged according to a stripe (e.g., S-stripe) arrangement structure, an RGBG (e.g., a PENTILE®, which is a duly registered trademark of Samsung Display Co., LTD.) arrangement structure, or the like. According to an embodiment, sizes between the sub-pixels SPX may be partially different from one another, and the sub-pixels SPX may have various suitable shapes. For example, the sub-pixels SPX may have a quadrangular shape or a hexagonal shape in a plan view. However, the present disclosure is not limited thereto.

Figure 3:
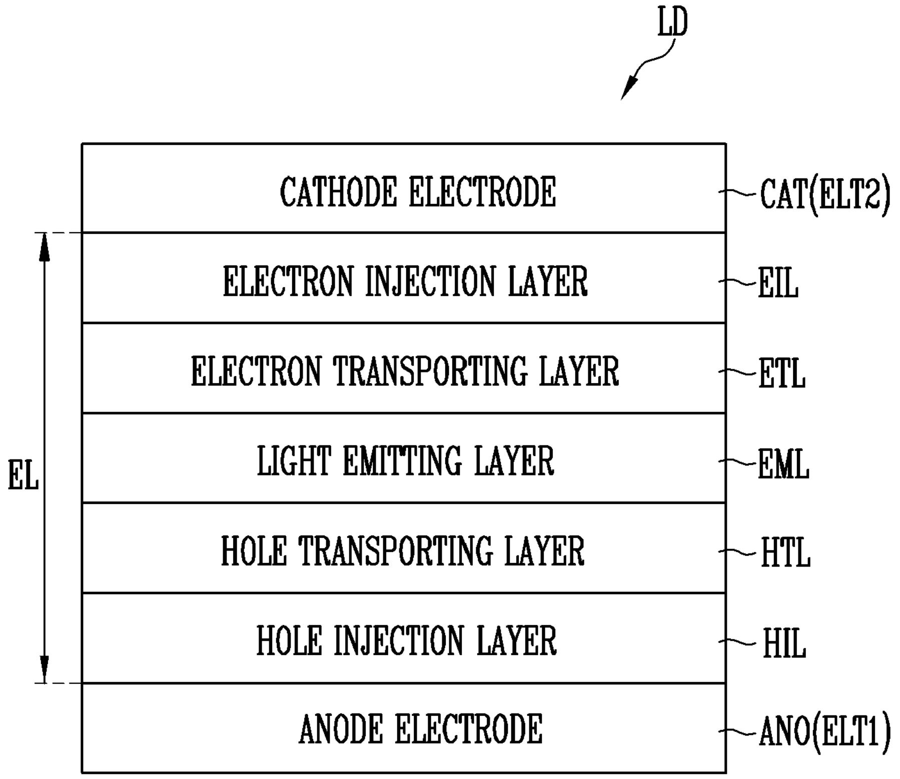
FIGS. 3 and 4 are schematic cross-sectional views illustrating a light emitting element according to one or more embodiments.
Figure 4:
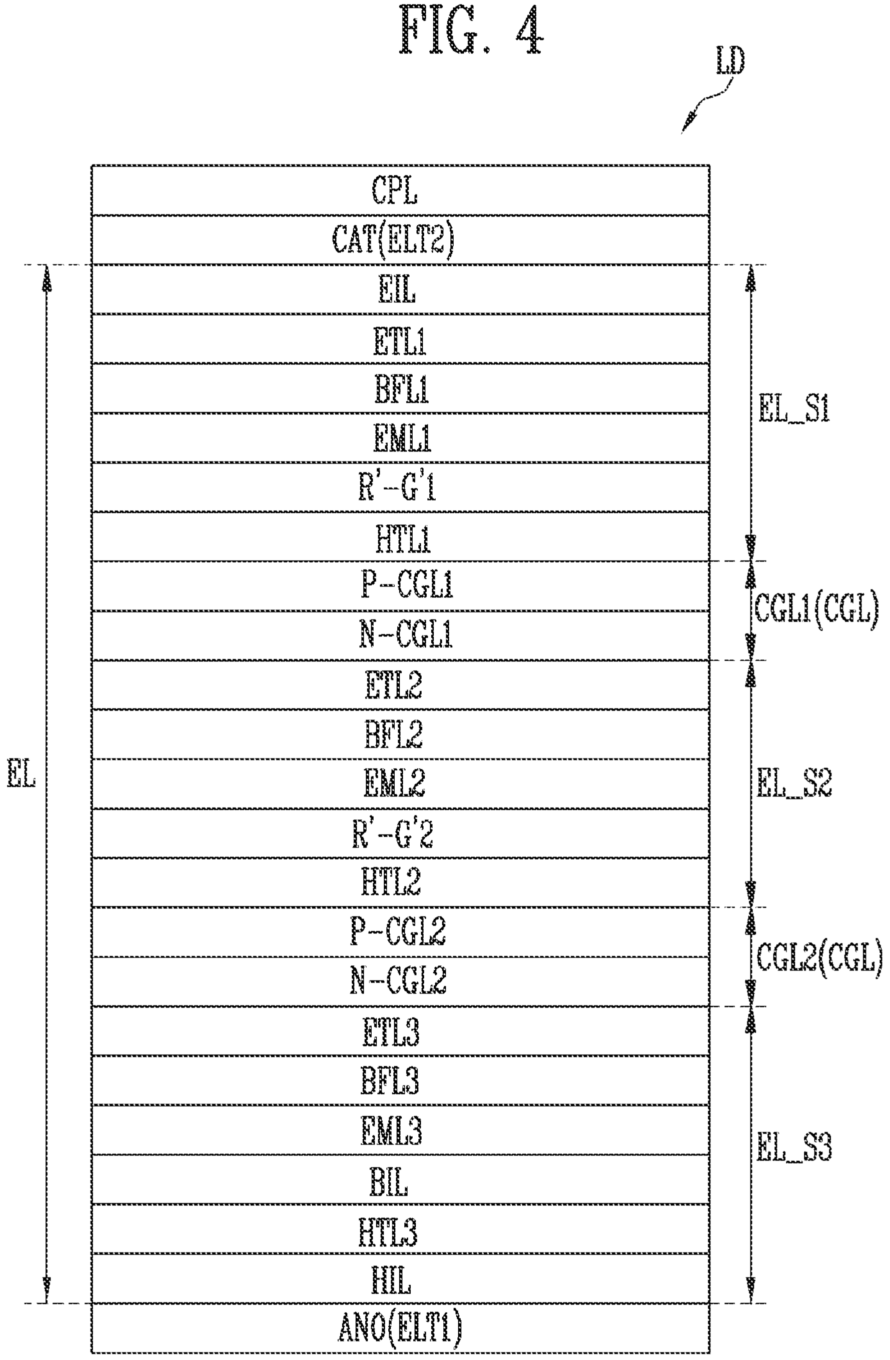

According to an embodiment, the pixel PXL includes a light emitting element LD (e.g., see FIGS. 3 and 4). The pixel PXL (or the sub-pixels SPX) may include a first sub-pixel SPX1, a second sub-pixel SPX2, and a third sub-pixel SPX3. At least one of the first sub-pixel SPX1, the second sub-pixel SPX2, and/or the third sub-pixel SPX3 may form one pixel unit PXU configured to emit light of various colors.

For example, each of the first sub-pixel SPX1, the second sub-pixel SPX2, and the third sub-pixel SPX3 may emit light of one corresponding color. For example, the first sub-pixel SPX1 may be a pixel (e.g., a red pixel) for emitting light of a first color (e.g., red), the second sub-pixel SPX2 may be a pixel (e.g., a green pixel) for emitting light of a second color (e.g., green), and the third sub-pixel SPX3 may be a pixel (e.g., a blue pixel) for emitting light of a third color (e.g., blue). However, the present disclosure is not limited thereto, and the color, type, number, and/or the like of the first sub-pixel SPX1, the second sub-pixel SPX2, and the third sub-pixel SPX3 configuring each pixel unit PXU are/is not limited thereto.

Figure 2:
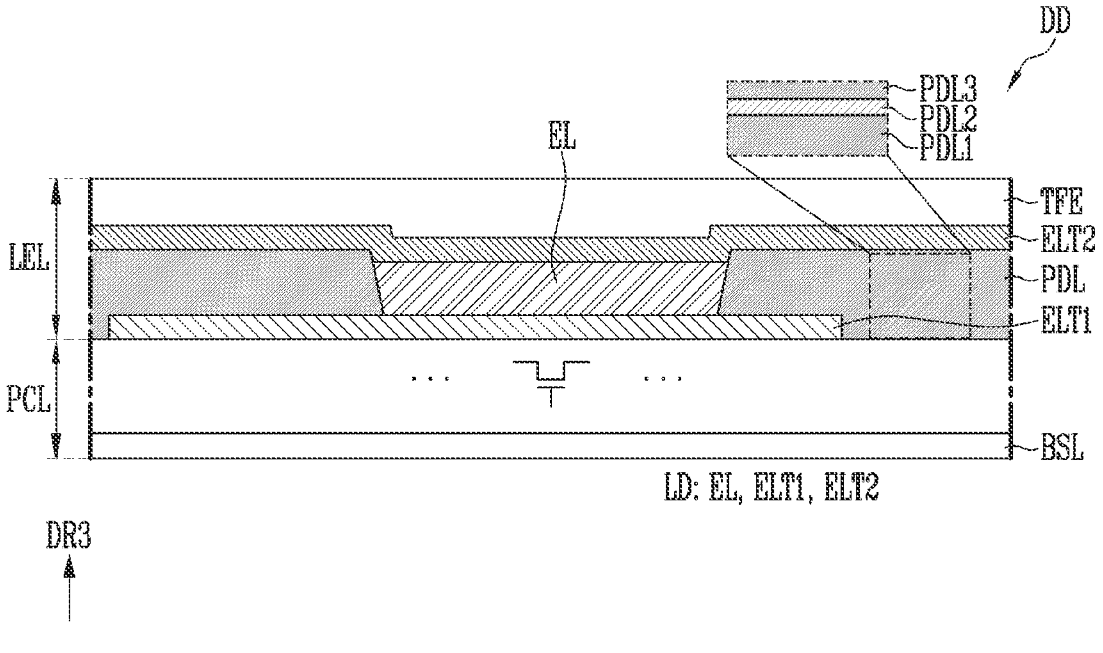
FIG. 2 is a schematic cross-sectional view illustrating a display device according to an embodiment.

FIG. 2 is a schematic cross-sectional view illustrating a display device according to an embodiment. FIGS. 3 and 4 are schematic cross-sectional views illustrating a light emitting element according to one or more embodiments.

Referring to FIGS. 2 to 4, the display device DD may include a pixel-circuit layer PCL and a light-emitting-element layer LEL.

The pixel-circuit layer PCL may include a pixel circuit PXC (e.g., refer to FIG. 5) for driving the light emitting element LD. The pixel-circuit layer PCL may include the base layer BSL, conductive layers for forming the pixel circuits PXC, and insulating layers disposed between the conductive layers.

According to an embodiment, the pixel circuit PXC may include a thin film transistor, and may be electrically connected to the light emitting element LD to provide an electrical signal for the light emitting element LD to emit light.

According to an embodiment, a circuit element (e.g., a transistor) forming the pixel circuit PXC may include various suitable semiconductor materials. For example, the semiconductor material may include one or more from among a group including polysilicon, low temperature polycrystalline silicon (LTPS), amorphous silicon, and/or an oxide semiconductor. According to an embodiment, the oxide semiconductor may include indium gallium zinc oxide (IGZO).

The light-emitting-element layer LEL may be disposed on the pixel-circuit layer PCL. According to an embodiment, the light-emitting-element layer LEL may include the light emitting element LD, a pixel defining layer PDL, and an encapsulation layer TFE.

The light emitting element LD may be disposed on the pixel-circuit layer PCL. According to an embodiment, the light emitting element LD may include a first electrode ELT1, a light emitting unit (e.g., a light emitting structure) EL, and a second electrode ELT2. According to an embodiment, the light emitting unit EL may be disposed in an area defined by the pixel defining layer PDL. One surface of the light emitting unit EL may be electrically connected to the first electrode ELT1, and another surface of the light emitting unit EL may be electrically connected to the second electrode ELT2.

The first electrode ELT1 may be an anode electrode ANO for the light emitting unit EL, and the second electrode ELT2 may be a cathode electrode CAT for the light emitting unit EL. According to an embodiment, the first electrode ELT1 and the second electrode ELT2 may include a conductive material. For example, the conductive material may include one or more from among a group including gold (Au), silver (Ag), aluminum (Al), molybdenum (Mo), chromium (Cr), titanium (Ti), nickel (Ni), neodymium (Nd), copper (Cu), and/or platinum (Pt). As another example, according to an embodiment, the conductive material may include one or more from among a group including silver nanowire (AgNW), indium tin oxide (ITO), indium zinc oxide (IZO), indium gallium zinc oxide (IGZO), antimony zinc oxide (AZO), indium tin zinc oxide (ITZO), zinc oxide (ZnO), tin oxide (SnO2), carbon nano tube, and/or graphene. However, the present disclosure is not limited thereto.

According to an embodiment, the second electrode ELT2 may be manufactured by being deposited on the entire or substantially the entire surface of the display area DA. Accordingly, power supplied to the second electrode ELT2 may be provided to each of the sub-pixels SPX. In this case, the second electrode ELT2 may include a metal material having a relatively low resistance, so that an influence of the resistance of the second electrode ELT2 may be reduced. Accordingly, in an embodiment, the second electrode ELT2 may include silver (Ag) or magnesium (Mg), without including aluminum (Al).

The light emitting unit EL may have a multilayered thin film structure including a light generation layer (e.g., a light emitting layer EML).

According to an embodiment, referring to FIG. 3, the light emitting unit EL may include a hole injection layer HIL for injecting a hole, a hole transport layer HTL, the light emitting layer EML, an electron transport layer ETL, and an electron injection layer EIL. The hole transport layer HTL may have an excellent hole transport property, and may increase a chance of recombination of a hole and an electron by suppressing a movement of an electron that is not combined in the light emitting layer EML. The light emitting layer EML may include a host and a dopant, and may emit light by the recombination of the injected electron and hole (e.g., by forming an exciton). The electron transport layer ETL may smoothly transport the electron to the light emitting layer, and the electron injection layer EIL may inject the electron.

According to an embodiment, referring to FIG. 4, the light emitting unit EL may have a tandem structure. For example, the light emitting unit EL may include a first sub-light emitting unit EL_S1, a second sub-light emitting unit EL_S2, a third sub-light emitting unit EL_S3, and a charge generation layer CGL. The charge generation layer CGL may include a first charge generation layer CGL1 and a second charge generation layer CGL2.

The first sub-emitting unit EL_S1 may emit light of the first color, and may be disposed between the second electrode ELT2 and the first charge generation layer CGL1. The first sub-light emitting unit EL_S1 may include a first hole transport layer HTL1, a first auxiliary hole transport layer R'-G'1, a first light emitting layer EML1, a first buffer layer BFL1, a first electron transport layer ETL1, and the electron injection layer EIL. The first auxiliary hole transport layer R'-G'1 may adjust a resonance period of provided light.

The second sub-light emitting unit EL_S2 may emit light of the second color, and may be disposed between the first charge generation layer CGL1 and the second charge generation layer CGL2. The second sub-light emitting unit EL_S2 may include a second hole transport layer HTL2, a second auxiliary hole transport layer R'-G'2, a second light emitting layer EML2, a second buffer layer BFL2, and a second electron transport layer ETL2. The second auxiliary hole transport layer R'-G'2 may adjust a resonance period of provided light.

The third sub-light emitting unit EL_S3 may emit light of the third color, and may be disposed between the first electrode ELT1 and the second charge generation layer CGL2. The third sub-light emitting unit EL_S3 may include the hole injection layer HIL, a third hole transport layer HTL3, a blue auxiliary layer BIL, a third light emitting layer EML3, a third buffer layer BFL3, and a third electron transport layer ETL3. The blue auxiliary layer BIL may improve light generation efficiency by adjusting a hole-charge balance.

The buffer layers BFL1, BFL2, and BFL3 may block injection of the hole from the light emitting layers EML1, EML2, and EML3 to the electron transport layers ETL1, ELT2, and ELT3, and may enhance the injection of the electron.

The charge generation layer CGL may transfer the electron or the hole from adjacent sub-light emitting units EL_S1, EL_S2, and EL_S3. The first charge generation layer CGL1 may be disposed between the first sub-light emitting unit EL_S1 and the second sub-light emitting unit EL_S2. The first charge generation layer CGL1 may include a first N-type charge generation layer N-CGL1 and a first P-type charge generation layer P-CGL1. The second charge generation layer CGL2 may be disposed between the second sub-light emitting unit EL_S2 and the third sub-light emitting unit EL_S3. The second charge generation layer CGL2 may include a second N-type charge generation layer N-CGL2 and a second P-type charge generation layer P-CGL2.

According to an embodiment, the light emitting layer EML may be a quantum dot light emitting layer. However, the material for forming the light emitting unit EL is not limited thereto.

According to an embodiment, the light emitting unit EL may emit light based on an electrical signal provided from the anode electrode ANO (e.g., the first electrode ELT1) and the cathode electrode CAT (e.g., the second electrode ELT2).

According to an embodiment, the light emitting element LD may further include a capping layer CPL disposed on the second electrode ELT2. The capping layer CPL may passivate other portions (e.g., the second electrode ELT2) of the light emitting element LD. The capping layer CPL may include an inorganic material. For example, the capping layer CPL may include one or more of a metal or a metal compound.

The pixel defining layer PDL may be disposed on the pixel-circuit layer PCL to define a position where the light emitting unit EL is arranged.

According to an embodiment, the pixel defining layer PDL may include an inorganic material. For example, the inorganic material may include one or more from among silicon oxide (SiOx) and silicon nitride (SiNx). According to an embodiment, the pixel defining layer PDL may have a multilayered structure in which a layer including silicon oxide (SiOx) and a layer including silicon nitride (SiNx) are stacked.

For example, the pixel defining layer PDL may include a first pixel defining layer PDL1, a second pixel defining layer PDL2 on the first pixel defining layer PDL1, and a third pixel defining layer PDL3 on the second pixel defining layer PDL2. The first pixel defining layer PDL1 and the third pixel defining layer PDL3 may include silicon oxide (SiOx), and the second pixel defining layer PDL2 may include silicon nitride (SiNx).

However, the present disclosure is not limited thereto. In another embodiment, the pixel defining layer PDL may include an organic material. For example, the organic material may include one or more from among a group including an acrylic resin, an epoxy resin, a phenol resin, a polyamide resin, and/or a polyimide resin.

In another embodiment, the pixel defining layer PDL may have a structure in which an organic material and an inorganic material are alternately disposed on one another.

The encapsulation layer TFE may be disposed on the light emitting element LD (e.g., on the second electrode ELT2). The encapsulation layer TFE may offset a step difference that may be generated by the light emitting element LD and the pixel defining layer PDL. The encapsulation layer TFE may include a plurality of insulating layers covering the light emitting element LD. According to an embodiment, the encapsulation layer TFE may have a structure in which an inorganic layer and an organic layer are alternately stacked. According to an embodiment, the encapsulation layer TFE may be a thin film encapsulation layer.

According to an embodiment, the display device DD may further include one or more additional layers (e.g., a window and/or the like) disposed on the light-emitting-element layer LEL. According to an embodiment, the display device DD may further include a color filter layer and/or a quantum-dot layer disposed on the light-emitting-element layer LEL.

According to an embodiment, the light-emitting-element layer LEL may further include a separator SEP (e.g., refer to FIG. 7) physically separating the light emitting units EL from each other of the adjacent sub-pixels SPX that are different from each other. The separator SEP is described in more detail below.

Figure 5:
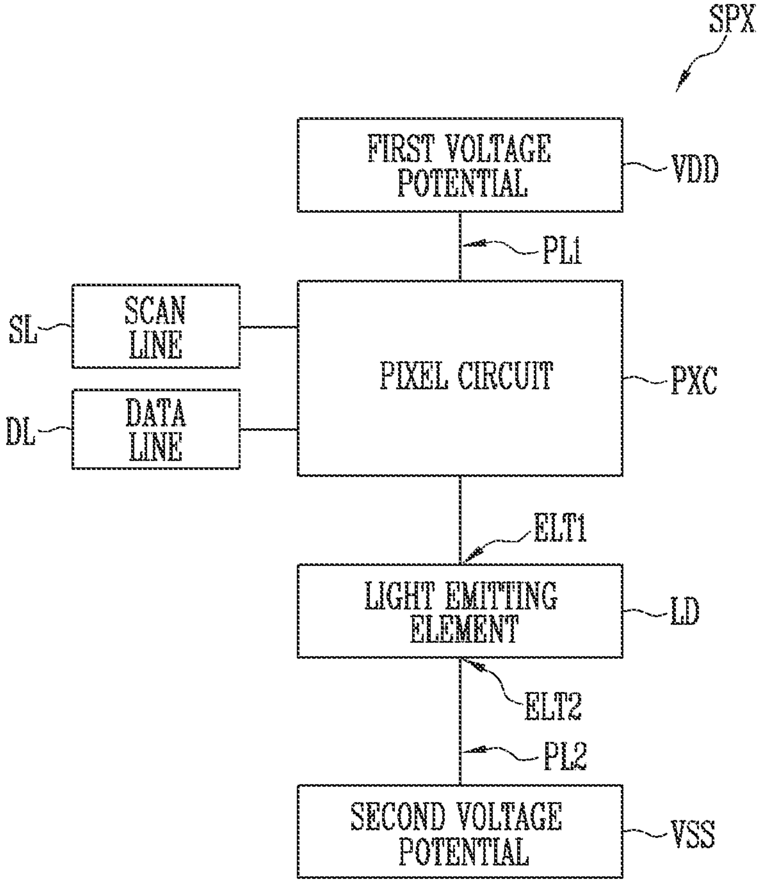
FIG. 5 is a schematic block diagram illustrating an electrical connection structure for a light emitting element according to an embodiment.
Figure 6:
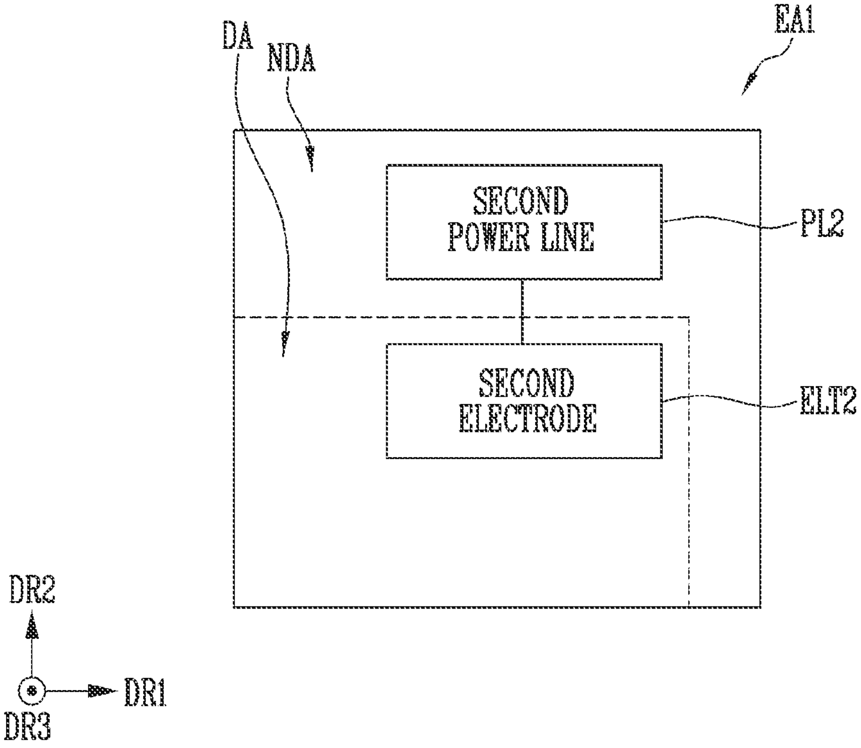
FIG. 6 is a schematic enlarged view illustrating the area EA1 of FIG. 1.

FIG. 5 is a schematic block diagram illustrating an electrical connection structure for a light emitting element according to an embodiment. For example, FIG. 5 may illustrate an electrical connection structure including the pixel circuit PXC corresponding to a sub-pixel SPX. FIG. 6 is a schematic enlarged view illustrating the area EA1 of FIG. 1. FIG. 6 illustrates a schematic plan view of a connection relationship between a second power line PL2 and the second electrode ELT2 according to an embodiment. For example, FIG. 6 may show a structure in which the second electrode ELT2 is electrically connected to the second power line PL2 formed in the non-display area NDA.

Referring to FIG. 5, the sub-pixel SPX may include the pixel circuit PXC configured to drive the light emitting element LD.

The pixel circuit PXC may include one or more circuit elements. For example, the pixel circuit PXC may include three transistors and a storage capacitor. For example, the pixel circuit PXC may include a driving transistor, a switching transistor, and a storage capacitor. However, the present disclosure is not limited thereto.

The pixel circuit PXC may be electrically connected to a scan line SL and a data line DL. The scan line SL may supply a scan signal to the pixel circuit PXC, and may be electrically connected to a gate electrode of the switching transistor of the pixel circuit PXC according to an embodiment. The light emitting element LD may emit light corresponding to a data signal provided from the data line DL.

The pixel circuit PXC may be electrically connected to a first power line PL1 and the second power line PL2. For example, the first electrode ELT1 of the light emitting element LD may be electrically connected to the pixel circuit PXC and the first power line PL1, and the second electrode ELT2 of the light emitting element LD may be electrically connected to the second power line PL2. The first power line PL1 and the second power line PL2 may be disposed on the base layer BSL.

Power from the first power line PL1 and power from the second power line PL2 may have different potentials from each other. For example, the power of the first power line PL1 may be a high-potential pixel power receiving power from a first voltage potential VDD, and the power of the second power line PL2 may be a low-potential pixel power receiving power from a second voltage potential VSS. A potential difference between the power of the first power line PL1 and the power of the second power line PL2 may be set to a threshold voltage or higher of the light emitting elements LD.

The first power line PL1 may be electrically connected to the pixel circuit PXC (e.g., to the driving transistor). The second power line PL2 may be electrically connected to the cathode electrode (e.g., the second electrode ELT2) of the light emitting element LD.

According to an embodiment, the second power line PL2 may be electrically connected to the second electrode ELT2. For example, referring to FIG. 6 together with FIG. 5, the second electrode ELT2 may receive the power of the second power line PL2 through the second power line PL2 disposed in the non-display area NDA. For example, the second electrode ELT2 in the display area DA may be adjacent to the second power line PL2, and an area where the display area DA and the non-display area NDA are adjacent to each other may be interposed between the second electrode ELT2 and the second power line PL2. The second electrode ELT2 that is adjacent to an outside of the display area DA may be electrically connected to the second power line PL2 in the non-display area NDA. As described above, because the second electrodes ELT2 in the display area DA are electrically connected to each other, the power provided by the second power line PL2 may be applied to the entire display area DA.

Each light emitting element LD may be connected in a forward direction between the first power line PL1 and the second power line PL2 to form each effective light source. The effective light sources may be gathered to configure the light emitting elements LD of the sub-pixel SPX.

The light emitting elements LD may emit light having a luminance corresponding to a driving current supplied through the pixel circuits PXC. During each frame period, the pixel circuit PXC may supply the driving current corresponding to the data signal to the light emitting element LD. The light emitting element LD may emit light having a luminance corresponding to a current flowing therethrough.

Hereinafter, a display device including a separator SEP according to one or more embodiments is described in more detail with reference to FIGS. 7 to 18. Redundant description with those of the embodiments described above may not be repeated or may be simplified hereinafter.

FIGS. 7 through 13 are schematic plan views illustrating a display device according to one or more embodiments. FIGS. 14 through 18 are schematic cross-sectional views illustrating a display device according to one or more embodiments.

Figure 7:
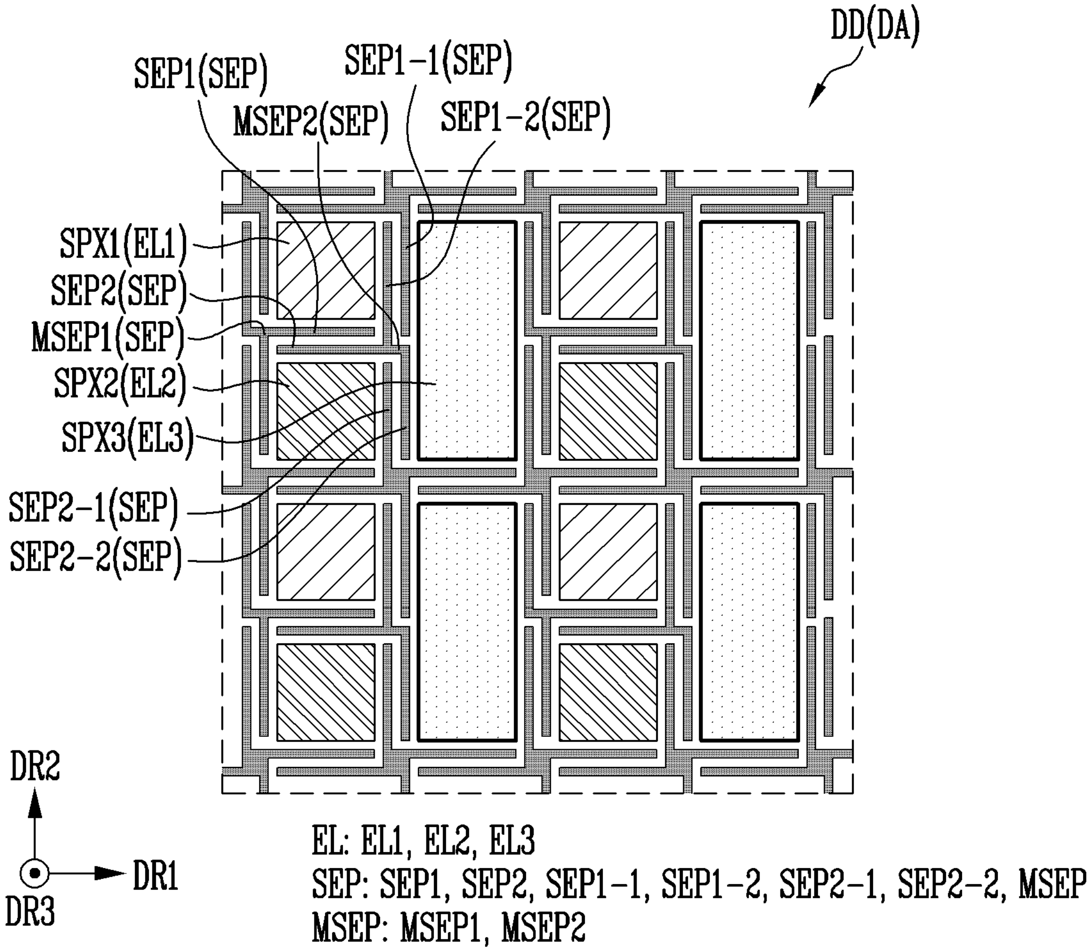
FIGS. 7-13 are schematic plan views illustrating a display device according to one or more embodiments.
Figure 8:
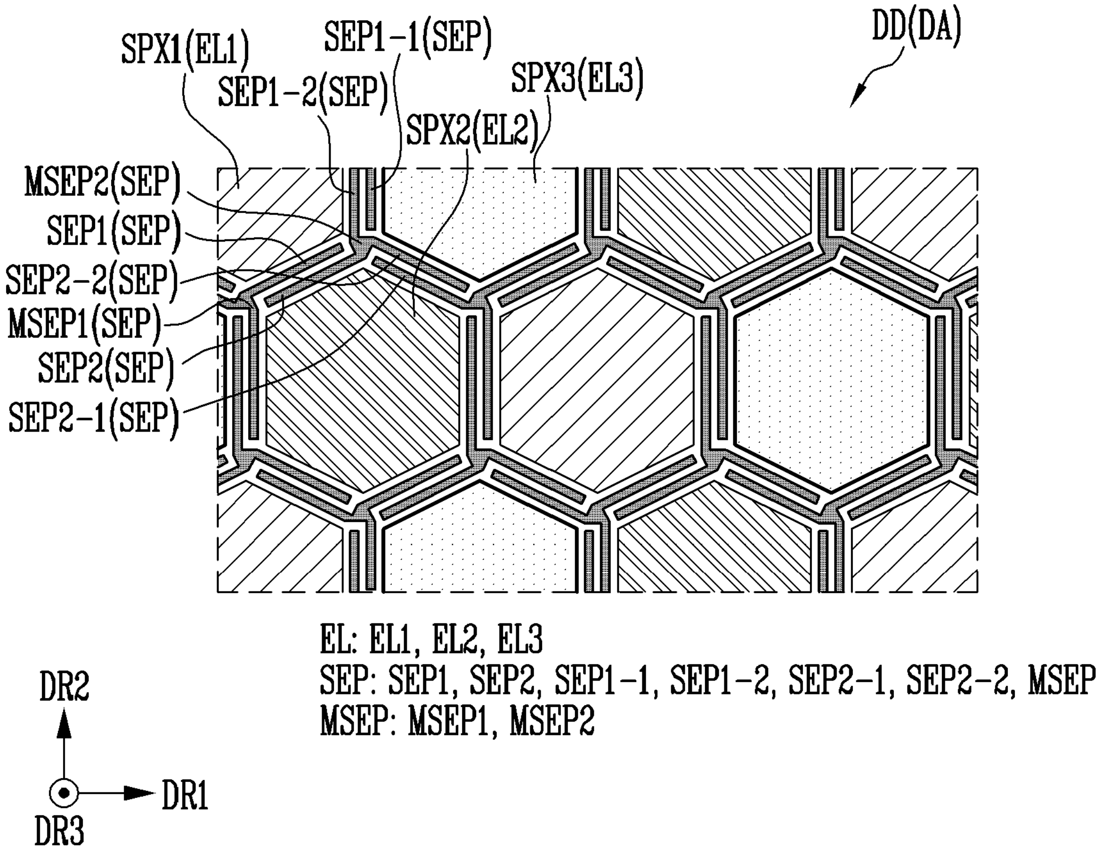
Figure 9:
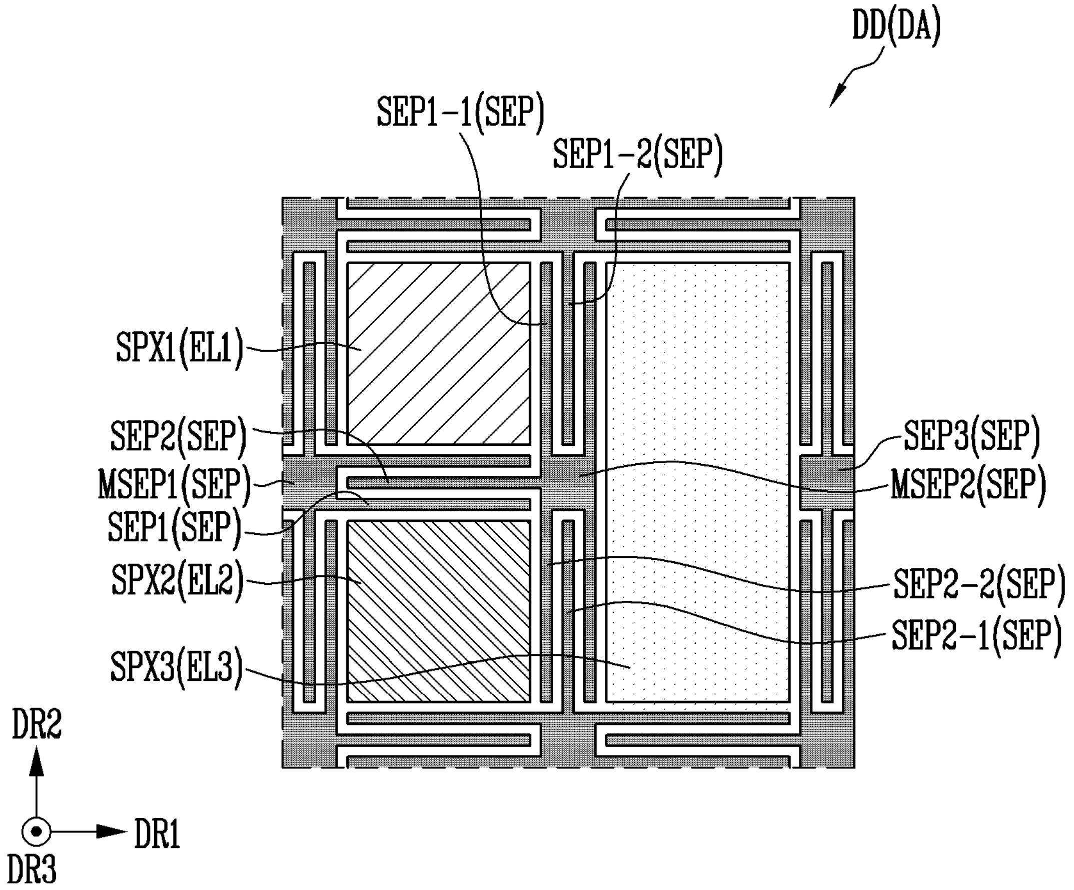
Figure 10:
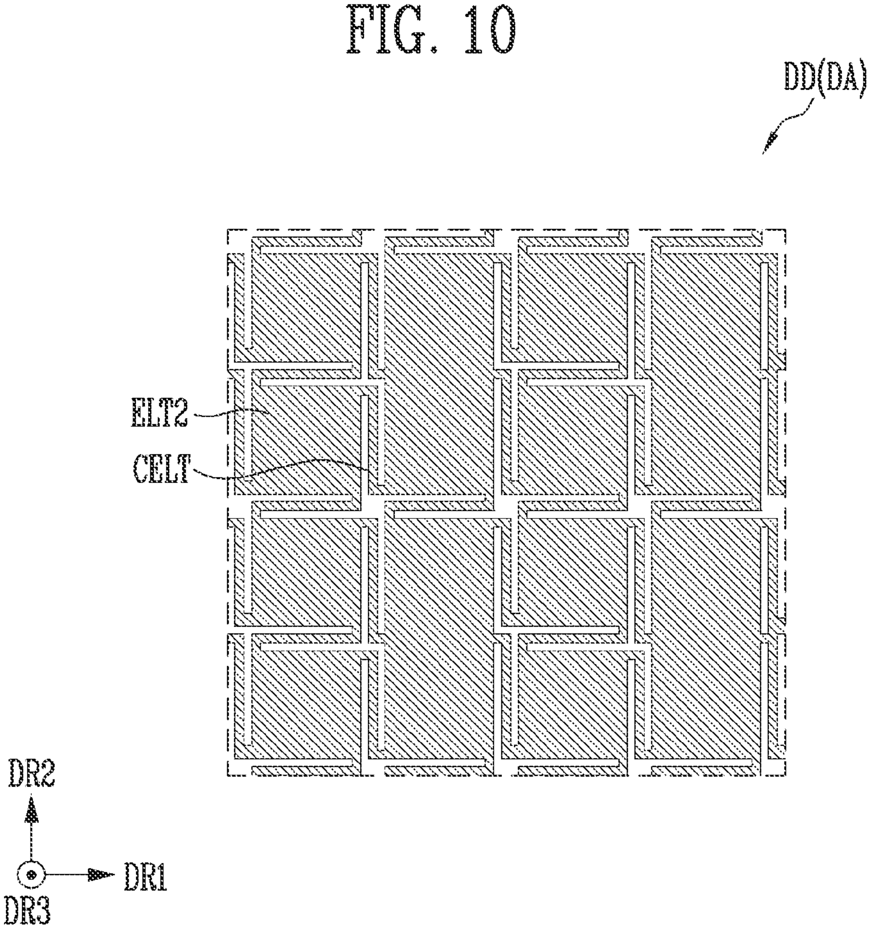

FIGS. 7 through 18 illustrate a portion of the display area DA. FIGS. 7 to 9 illustrate a positional relationship on a plane (e.g., in a plan view) between the light emitting units EL and the separator SEP, which are divided to form the sub-pixels SPX. FIG. 10 illustrates a positional relationship between the second electrode ELT2 and a connection electrode CELT on a plane (e.g., in a plan view). FIGS. 7 and 10 show different configurations, respectively, disposed in the same area of a portion in the display area DA. Referring to FIGS. 7 and 10 together, a positional relationship between the light emitting units EL, the separator SEP, the second electrode ELT2, and the connection electrode CELT are shown.

According to an embodiment, the light emitting units EL, the separator SEP, the second electrode ELT2, and the connection electrode CELT may be disposed in the display area DA.

Each of the light emitting units EL may be disposed in a corresponding area surrounded (e.g., around a periphery thereof) by the separator SEP. The light emitting units EL may include a first light emitting unit EL1 forming the first sub-pixel SPX1 for emitting light of the first color, a second light emitting unit EL2 forming the second sub-pixel SPX2 for emitting light of the second color, and a third light emitting unit EL3 forming the third sub-pixel SPX3 for emitting light of the third color. According to an embodiment, the light emitting layer EML of the first light emitting unit EL1 may be a first light emitting layer including a first material, the light emitting layer EML of the second light emitting unit EL2 may be a second light emitting layer including a second material, and the light emitting layer EML of the third light emitting unit EL3 may be a third light emitting layer including a third material.

For example, the light emitting unit EL may be disposed in a partial area of the display area DA to define an area from which light of different colors from each other are respectively emitted. According to an embodiment, the first light emitting unit EL1 may form a first light emitting element for emitting the light of the first color, the second light emitting unit EL2 may form a second light emitting element for emitting the light of the second color, and the third light emitting unit EL3 may form a third light emitting element for emitting the light of the third color.

However, the present disclosure is not limited thereto. According to an embodiment, the light emitting unit EL may include a tandem structure, and may emit white light.

The separator SEP may be disposed around (e.g., adjacent to) each of the light emitting units EL. The separator SEP may surround (e.g., around a periphery of) at least a portion of each of the light emitting units EL in a plan view. The separator SEP may be disposed in a boundary area between adjacent light emitting units EL (or sub-pixels SPX). For example, the separator SEP may be disposed between the first sub-pixel SPX1 and the second sub-pixel SPX2, between the first sub-pixel SPX1 and the third sub-pixel SPX3, and between the second sub-pixel SPX2 and the third sub-pixel SPX3.

According to an embodiment, the separator SEP may include a plurality of structures for forming a labyrinth structure. For example, the separator SEP may include a first separator SEP1, a second separator SEP2, a (1-1)-th adjacent separator SEP1-1, a (1-2)-th adjacent separator SEP1-2, a (2-1)-th adjacent separator SEP2-1, a (2-2)-th adjacent separator SEP2-2, and an intermediate connection separator MSEP, which are described in more detail below.

As described above, the sub-pixels SPX may be arranged in various suitable structures. For example (FIG. 7), the first sub-pixel SPX1 and the second sub-pixel SPX2 may be disposed along a first pixel column along a second direction DR2, and the third sub-pixel SPX3 may be disposed along a second pixel column along the second direction DR2. In this case, a size of the third sub-pixel SPX3 may be greater than a size of the first sub-pixel SPX1 and a size of the second sub-pixel SPX2. As another example, referring to FIG. 8, each of the first sub-pixel SPX1, the second sub-pixel SPX2, and the third sub-pixel SPX3 may have a hexagonal shape. The first sub-pixel SPX1, the second sub-pixel SPX2, and the third sub-pixel SPX3 may be sequentially arranged.

The second electrode ELT2 may be disposed in the display area DA. The second electrode ELT2 may be disposed in an area where each corresponding sub-pixel SPX (or light emitting unit EL) is disposed.

The connection electrode CELT may be disposed in the display area DA. The second electrode ELT2 and the connection electrode CELT may be formed together in the same or substantially the same process. For example, the second electrode ELT2 and the connection electrode CELT may be deposited in the same or substantially the same process as each other, and thus, may include the same material as each other. The second electrode ELT2 and the connection electrode CELT may be integrally formed with each other.

The connection electrode CELT may electrically connect the second electrodes ELT2 that are adjacent to each other. For example, the connection electrode CELT may electrically connect the second electrode ELT2 disposed on one side of the connection electrode CELT and the second electrode ELT2 disposed on another side of the connection electrode CELT to each other. Accordingly, the power supplied by the second power line PL2 may be supplied to the second electrodes ELT2 disposed in two or more areas of the display area DA.

Referring to FIGS. 11 to 18, multiple separating structures of the separator SEP are illustrated in more detail.

Figure 11:
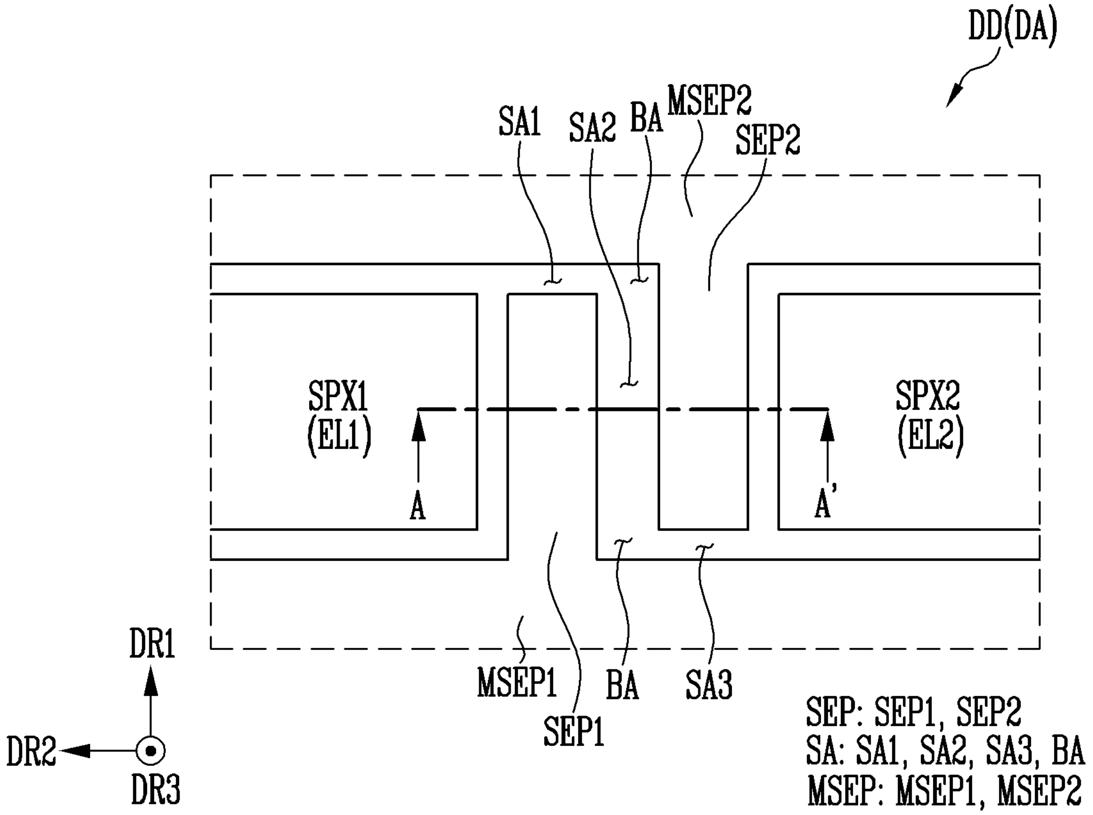
Figure 12:
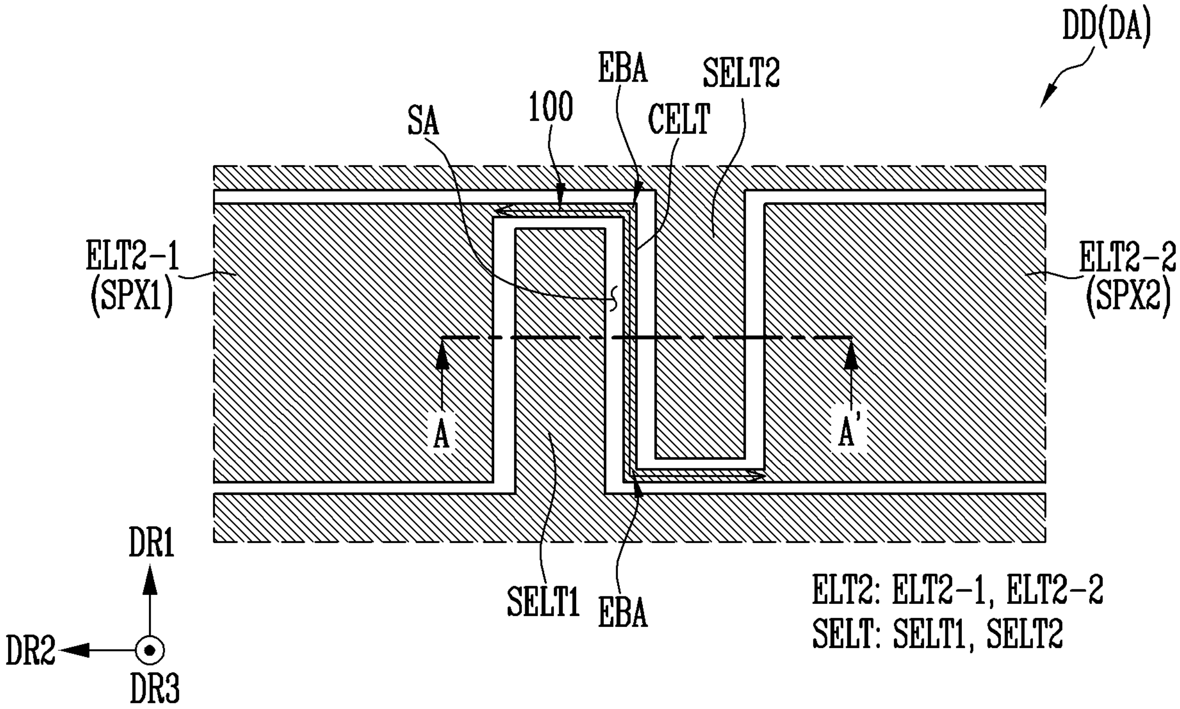
Figure 13:
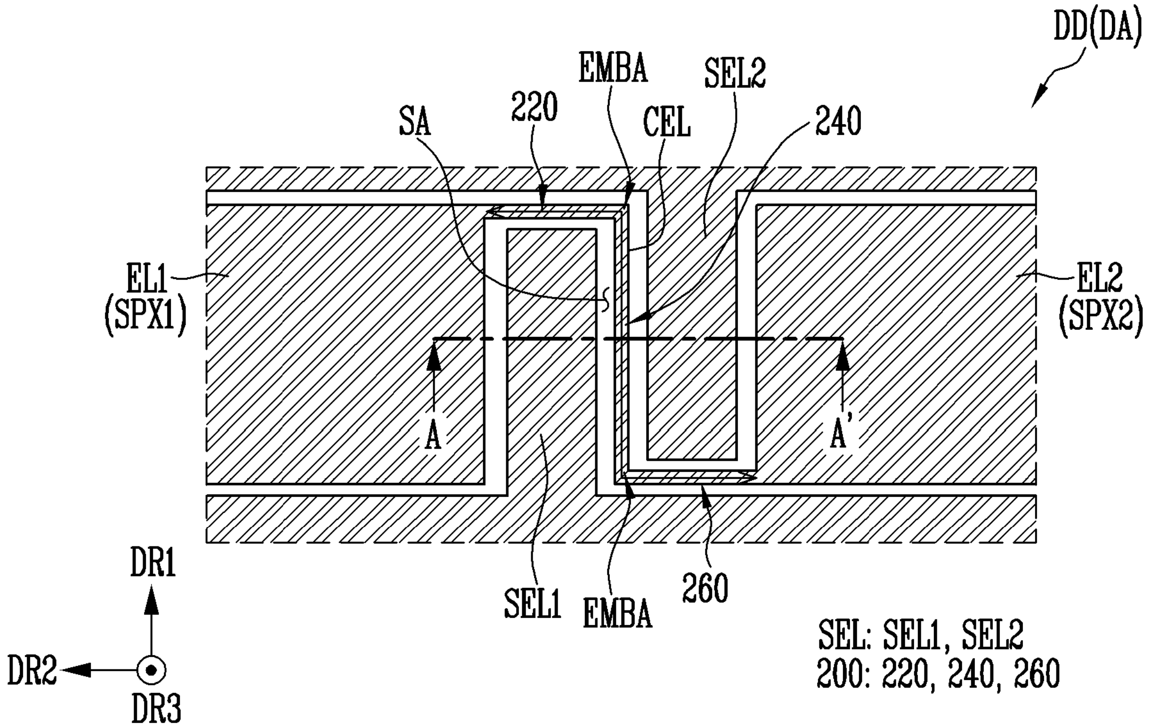
Figure 14:
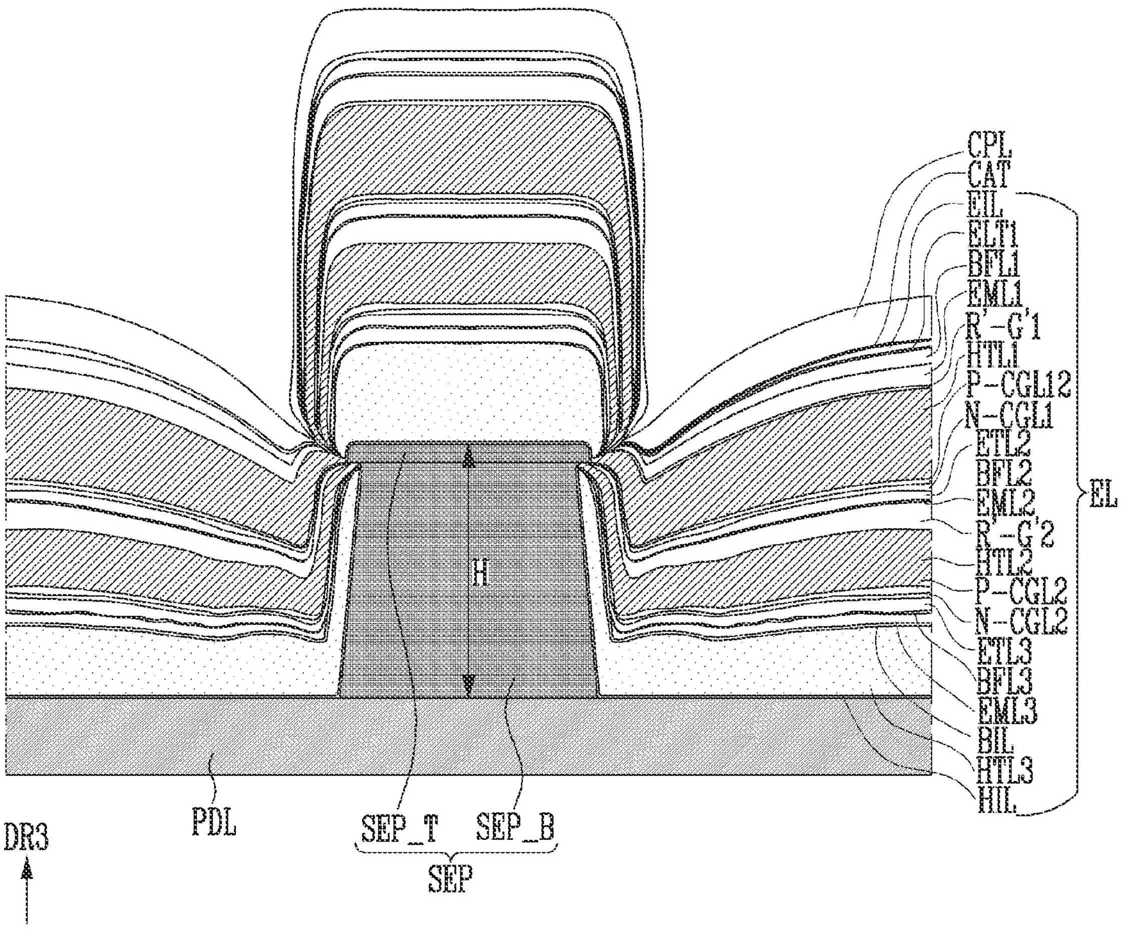
FIGS. 14-18 are schematic cross-sectional views illustrating a display device according to one or more embodiments.
Figure 15:
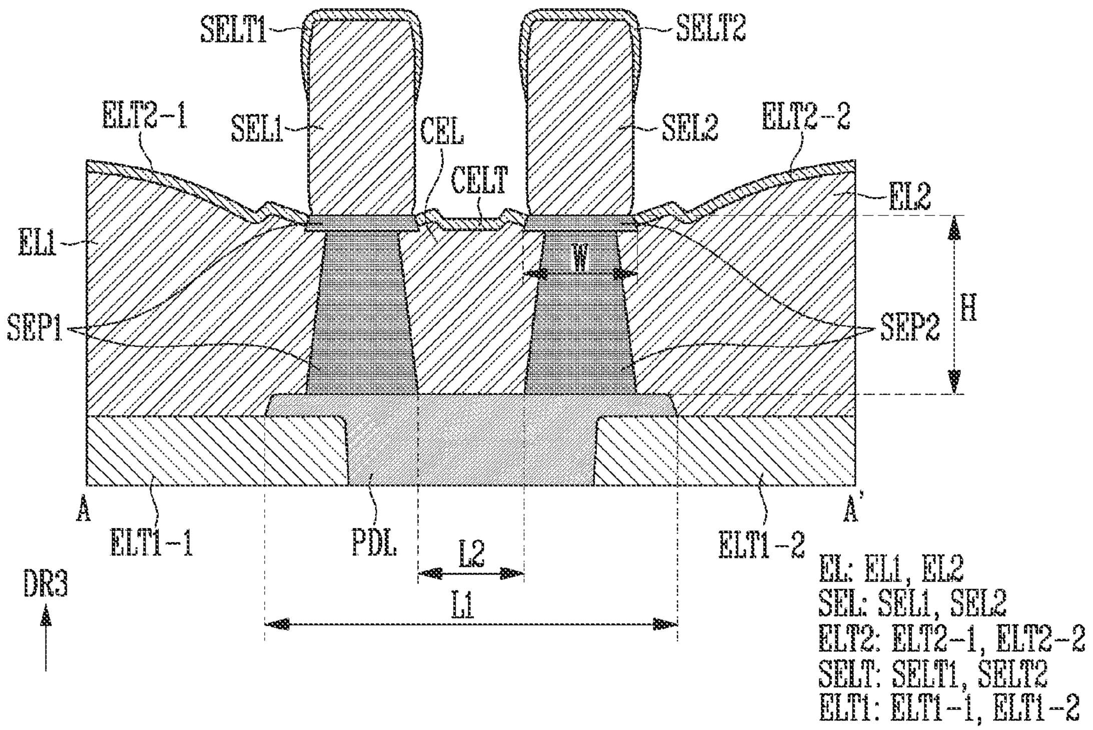
Figure 16:
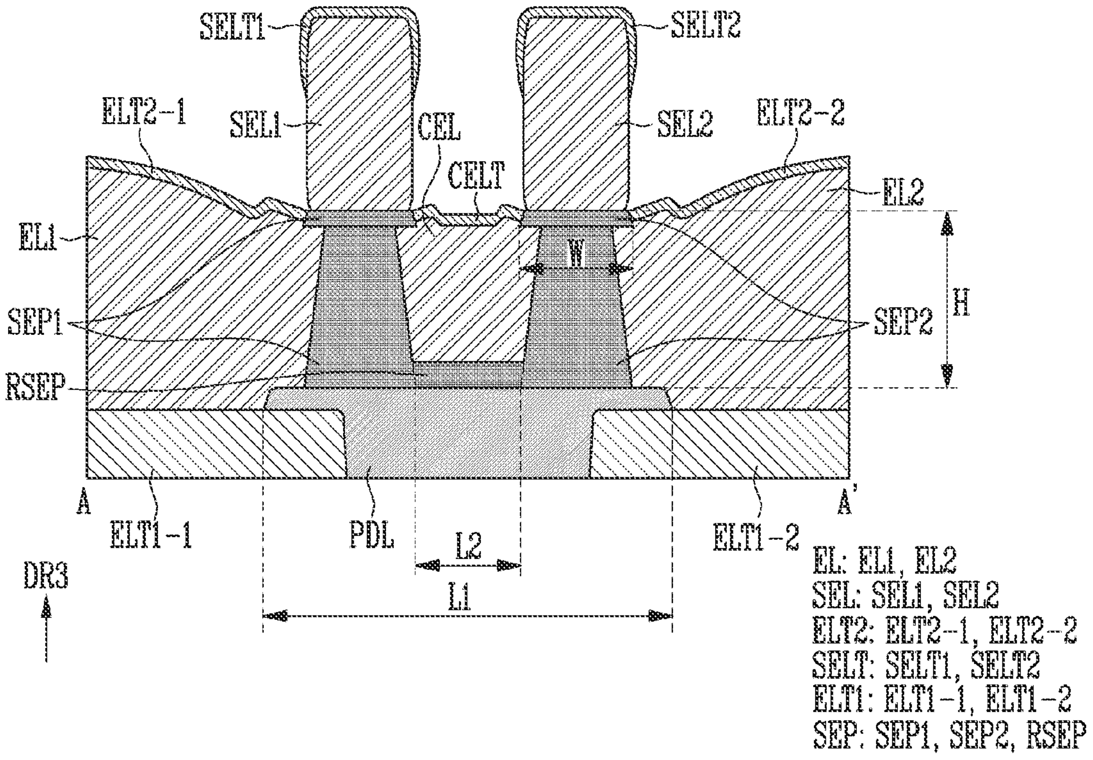
Figure 17:
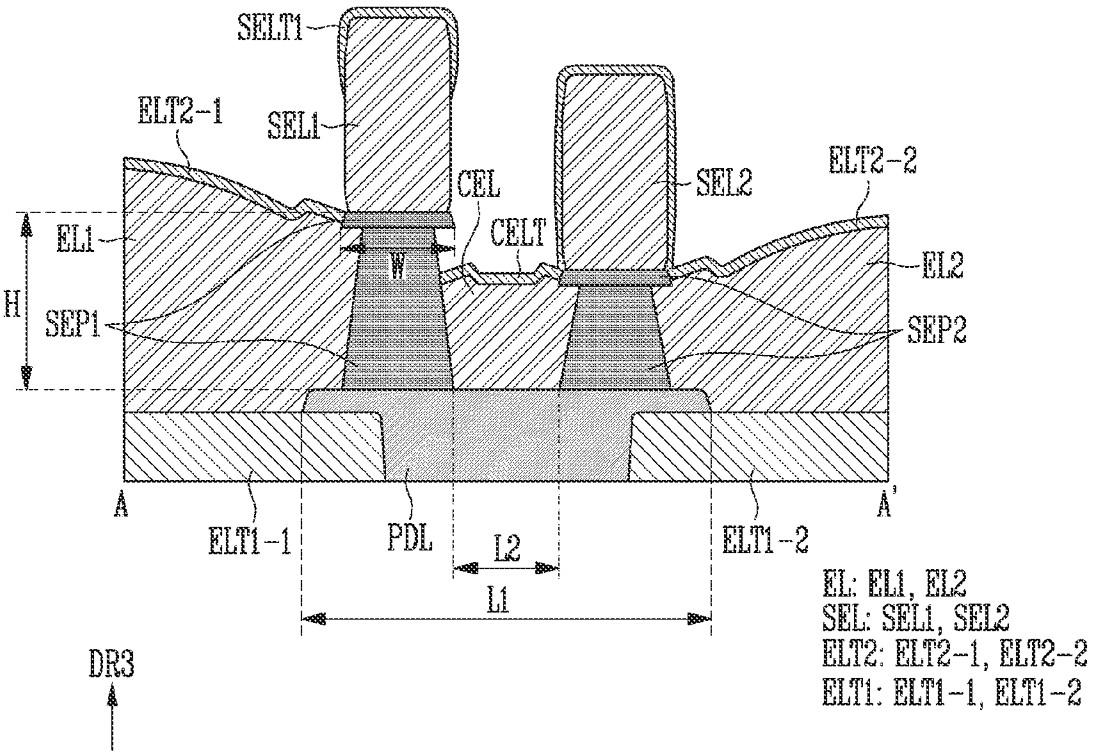
Figure 18:
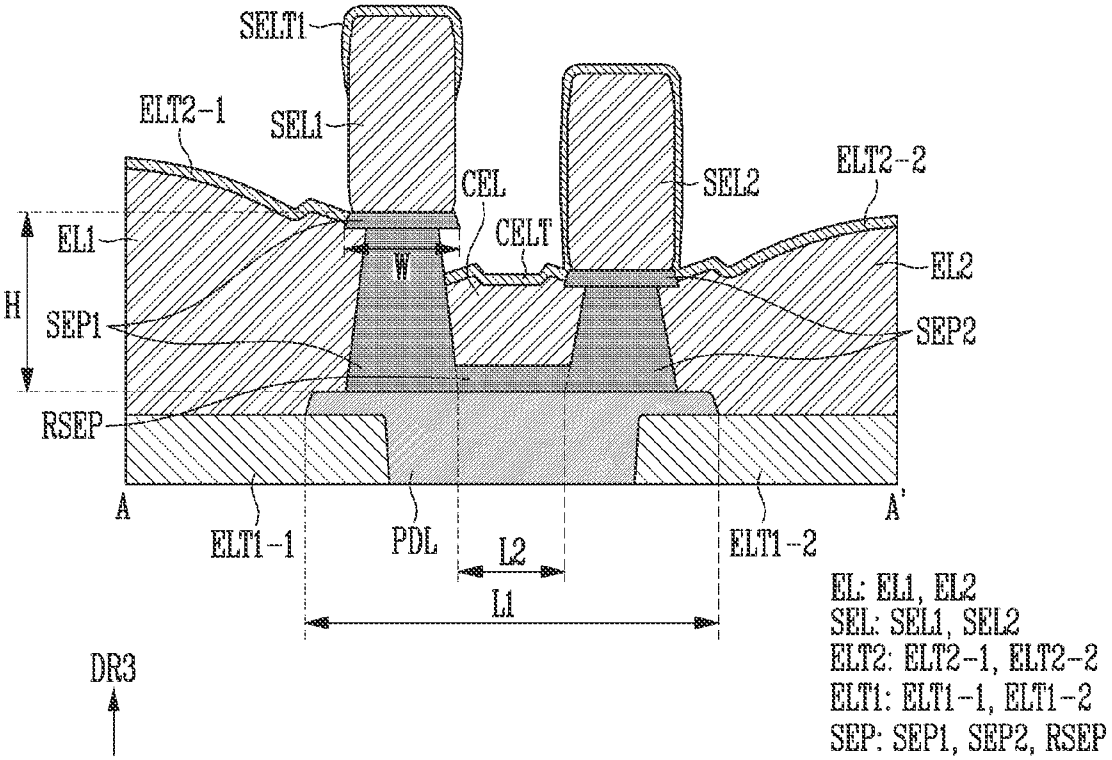

FIGS. 11 to 18 show configurations of the light-emitting-element layer LEL in an area where the first sub-pixel SPX1 and the second sub-pixel SPX2 are adjacent to each other. FIGS. 11 to 13 show configurations in the same area as each other. FIG. 14 is a cross-sectional view illustrating a layer forming a separator SEP and a light emitting unit EL adjacent thereto according to an embodiment. FIG. 15 is a schematic cross-sectional view taken along the lines A-A' of FIGS. 11 to 13. FIGS. 16 to 18 are schematic cross-sectional views showing an implement structure partially modified at a position corresponding to FIG. 15.

FIG. 11 shows the separator SEP disposed in an area in the display area DA. FIG. 12 shows the second electrode ELT2, the connection electrode CELT, and a separation electrode SELT disposed in an area in the display area DA. FIG. 13 shows the light emitting unit EL, a light emitting connection part CEL, and a light emitting separation part SEL disposed in an area in the display area DA. FIG. 14 shows the pixel defining layer PDL, the separator SEP, the light emitting unit EL, and the second electrode ELT2 disposed in an area in the display area DA. FIGS. 15 and 18 show the first electrode ELT1, the pixel defining layer PDL, the light emitting unit EL, the separator SEP, the light emitting connection part CEL, the light emitting separation part SEL, the second electrode ELT2, the connection electrode CELT, and the separation electrode SELT on the base layer BSL in an area where the first sub pixel SPX1 and the second sub pixel SPX2 are adjacent to each other.

According to an embodiment, the separator SEP may have a structure in which at least a portion of the separator SEP protrudes in a planar direction. Accordingly, the separator SEP may separate the adjacent light emitting unit EL and light emitting separation part SEL from each other, and may separate the adjacent second electrode ELT2 and separation electrode SELT from each other.

For example, the separator SEP may include a body portion SEP_B and a protrusion portion SEP_T. The protrusion portion SEP_T may be disposed on the body portion SEP_B, and may protrude in a direction to form a tip structure. When the protrusion portion SEP_T is formed, and the materials for forming the light emitting unit EL and the second electrode ELT2 are deposited, a structure in which some layers are spaced apart from each other may be formed. For example, in FIG. 14, corresponding to an embodiment of the light emitting unit EL described above with reference to FIG. 4, an embodiment in which the light emitting unit EL includes the first sub-light emitting unit EL_S1, the second sub-light emitting unit EL_S2, the third sub-light emitting unit EL_S3, and the charge generation layer CGL is shown. Referring to FIG. 14, it may be seen that some layers are spaced apart from each other adjacent to the protrusion portion SEP_T.

According to an embodiment, the body portion SEP_B may include silicon nitride (SiNx). The protrusion portion SEP_T may include silicon oxide (SiOx). However, the present disclosure is not limited thereto.

According to an embodiment, the separator SEP may form the multiple separating structures (e.g., separator structures), and the multiple separating structures may be spaced apart from each other to define a separation area SA. The separation area SA may include an area between a portion of the separator SEP and another portion of the separator SEP. The separator SEP may include two or more separators spaced apart from each other in a direction (e.g., in the first direction DR1) in which the sub-pixels SPX are spaced apart from each other. For example, the separator SEP may include a first separator SEP1 and a second separator SEP2.

However, the number of separators SEP for forming the multiple separating structures is not particularly limited thereto. For example, as shown in FIG. 9, the separator SEP may include three spaced apart separators by further including a third separator SEP3. For convenience, embodiments will be described in more detail hereinafter based on the assumption that the separator SEP includes the first separator SEP1 and the second separator SEP2.

In addition, a structural relationship between the separator SEP and the sub-pixels SPX is described in more detail hereinafter based on a structural relationship between the separator SEP and the first and second sub-pixels SPX1 and SPX2. However, the features described in more detail below may also be defined between the first sub-pixel SPX1 and the third sub-pixel SPX3, and may also be defined between the second sub-pixel SPX2 and the third sub-pixel SPX3.

The first separator SEP1 and the second separator SEP2 may be disposed between the sub-pixels SPX. The first separator SEP1 and the second separator SEP2 may be disposed between the first light emitting unit EL1 and the second light emitting unit EL2.

According to an embodiment, the first separator SEP1 and the second separator SEP2 may be spaced apart from each other with the separation area SA interposed therebetween. For example, the first separator SEP1 may be disposed between the separation area SA and the first sub-pixel SPX1 (or the first light emitting unit EL1). The second separator SEP2 may be disposed between the separation area SA and the second sub-pixel SPX2 (or the second light emitting unit EL2). For example, the first separator SEP1 and the second separator SEP2 may be disposed between the first sub-pixel SPX1 and the second sub-pixel SPX2. The first separator SEP1 and the second separator SEP2 may be spaced apart from each other in a direction (e.g., in the first direction DR1) in which the first sub-pixel SPX1 and the second sub-pixel SPX2 are spaced apart from each other. The first separator SEP1 may be disposed on one side of the separation area SA, and the second separator SEP2 may be disposed on another side of the separation area SA.

According to an embodiment, the separator SEP may include the intermediate connection separator MSEP. According to an embodiment, the intermediate connection separator MSEP may be directly adjacent to all of the first sub-pixel SPX1, the second sub-pixel SPX2, and the third sub-pixel SPX3. For example, the intermediate connection separator MSEP may be disposed in an area adjacent to all of the first sub-pixel SPX1, the second sub-pixel SPX2, and the third sub-pixel SPX3.

According to an embodiment, a portion (e.g., the first separator SEP1, the second separator SEP2, or the like) of the separator SEP protruding from the intermediate connection separator MSEP may be disposed between the sub-pixels SPX adjacent to each other.

According to an embodiment, the intermediate connection separator MSEP may be spaced apart from the portion of the separator SEP disposed between the sub-pixels SPX adjacent to each other, and may be connected to another portion.

According to an embodiment, the intermediate connection separator MSEP may be spaced apart from a portion of the separator SEP disposed between the first sub-pixel SPX1 and the second sub-pixel SPX2, and may be connected to another portion.

According to an embodiment, the intermediate connection separator MSEP may include a first intermediate connection separator MSEP1 and a second intermediate connection separator MSEP2. The first intermediate connection separator MSEP1 may be disposed on one side of an area between the first sub-pixel SPX1 and the second sub-pixel SPX2, and may be connected to the first separator SEP1, while spaced apart from the second separator SEP2. The second intermediate connection separator MSEP2 may be disposed on another side of the area between the first sub-pixel SPX1 and the second sub-pixel SPX2, and may be connected to the second separator SEP2, while spaced apart from the first separator SEP1.

According to an embodiment, the intermediate connection separator MSEP may be spaced apart from a portion of the separator SEP disposed between the first sub-pixel SPX1 and the third sub-pixel SPX3, and may be connected to another portion. For example, the second intermediate connection separator MSEP2 may be spaced apart from a (1-1)-th adjacent separator SEP1-1 defined between the first sub-pixel SPX1 and the third sub-pixel SPX3, and may be connected to a (1-2)-th adjacent separator SEP1-2 defined between the first sub-pixel SPX1 and the third sub-pixel SPX3.

According to an embodiment, the intermediate connection separator MSEP may be connected to a portion of the separator SEP disposed between the second sub-pixel SPX2 and the third sub-pixel SPX3. For example, the second intermediate connection separator MSEP2 may be spaced apart from a (2-1)-th adjacent separator SEP2-1 defined between the second sub-pixel SPX2 and the third sub-pixel SPX3, and may be connected to a (2-2)-th adjacent separator SEP2-2 defined between the second sub-pixel SPX2 and the third sub-pixel SPX3.

According to an embodiment, the separator SEP may form a labyrinth shape structure. For example, the separation area SA may include one or more bending areas BA. The number of bending areas BA formed in the separation area SA between the sub-pixels SPX adjacent to each other is not particularly limited. According to an embodiment, the separator SEP may have a structure in which at least a portion thereof is bent, and thus, the bending area BA may be formed. For example, the separation area SA may include a first separation area SA1 defined between the first separator SEP1 and the second intermediate connection separator MSEP2, a second separation area SA2 defined between the first separator SEP1 and the second separator SEP2, and a third separation area SA3 defined between the second separator SEP2 and the first intermediate connection separator MSEP1. The first separation area SA1 and the second separation area SA2 may extend in directions different from each other, and the bending area BA may be formed. For example, an area where the first separation area SA1 and the second separation area SA2 are adjacent to each other may be defined as the bending area BA. The second separation area SA2 and the third separation area SA3 may extend in directions different from each other, and the bending area BA may be formed. For example, an area where the second separation area SA2 and the third separation area SA3 are adjacent to each other may be defined as the bending area BA.

At least a portion of each of the first separator SEP1 and the second separator SEP2 may extend in a direction (e.g., in the second direction DR2) different from the direction in which the first sub-pixel SPX1 and the second sub-pixel SPX2 are spaced apart for each other. The separation area SA may be disposed in an area where the first separator SEP1 and the second separator SEP2 are not disposed. For example, the separation area SA may be formed along an area where the separators SEP are not disposed.

According to an embodiment (e.g., refer to FIGS. 15 and 16), the first separator SEP1 and the second separator SEP2 may have the same or substantially the same height as each other. However, the present disclosure is not limited thereto. In another embodiment (e.g., refer to FIGS. 17 and 18), the first separator SEP1 and the second separator SEP2 may have heights that are different from each other.

According to an embodiment, the separator SEP may have one width W and one height H. The width W of the separator SEP may be defined based on a direction in which the sub-pixels SPX are spaced apart from each other. The height H of the separator SEP may be defined based on a thickness direction of the base layer BSL, or a normal direction of a plane on which the base layer BSL is disposed.

According to an embodiment, the height H may be 900 Å or more. For example, the height H may be about 1000 Å or more, and the height H may be 1000 Å to 4000 Å. According to an embodiment, in a case where the separator SEP has a height H of 1000 Å or more, when layers for forming the light emitting unit EL are deposited, the light emitting separation part SEL and the light emitting units EL may be physically separated from each other. In addition, when the height H is greater than 4000 Å, a thickness of the light-emitting-element layer LEL may be excessively increased.

According to an embodiment, when the first separator SEP1 has a height H greater than that of the second separator SEP2, the first separator SEP1 may have a height of 1000 Å to 4000 Å, and the second separator SEP2 may have a height less than that of the first separator SEP1. For example, the second separator SEP2 may have a height H of 1000 Å to 4000 Å that is less than the height H of the first separator SEP1. According to an embodiment, the height H of the second separator SEP2 may be less than 1000 Å.

According to an embodiment, a ratio of the height H to the width W may be about 1.2 to about 1.8. For example, the ratio of the height H to the width W may be about 1.5. In the above-described numerical range, the separation electrode CELT and the light emitting separation part CEL that are spaced apart from the other layers may be formed while securing an area for forming the connection electrode CELT and the light emitting connection part CEL.

The separation area SA may connect areas in which the sub-pixels SPX are formed to each other. For example, the separation area SA may connect an area where the first sub-pixel SPX1 is formed and an area where the second sub-pixel SPX2 is formed to each other. The separation area SA may connect an area where the first light emitting unit EL1 is disposed and an area where the second light emitting unit EL2 is disposed to each other.

The second electrodes ELT2 of each of the sub-pixels SPX may be electrically connected by the connection electrode CELT. For example, the second electrode ELT2 may include a (2-1)-th electrode ELT2-1 included in the first sub-pixel SPX1, and a (2-2)-th electrode ELT2-2 included in the second sub-pixel SPX2. The (2-1)-th electrode ELT2-1 and the (2-2)-th electrode ELT2-2 may be electrically connected to each other by the connection electrode CELT.

The connection electrode CELT may be disposed in the separation area SA. The connection electrode CELT may be patterned in an area where the separator SEP is not disposed. Accordingly, the connection electrode CELT disposed in the separation area SA may electrically connect the (2-1)-th electrode ELT2-1 and the (2-2)-th electrode ELT2-2 to each other.

According to an embodiment, the display device DD may further include the separation electrode SELT. The separation electrode SELT may be disposed on the separator SEP. The separation electrode SELT may be disposed on the light emitting separation part SEL. For example, the separation electrode SELT may include a first separation electrode SELT1 and a second separation electrode SELT2. The light emitting separation part SEL may include a first light emitting separation part SEL1 and a second light emitting separation part SEL2. The first separation electrode SELT1 may be disposed on the first separator SEP1. The first separation electrode SELT1 may be disposed on the first light emitting separation part SEL1. The second separation electrode SELT2 may be disposed on the second separator SEP2. The second separation electrode SELT2 may be disposed on the second light emitting separation part SEL2.

According to an embodiment, the separation electrode SELT may have a shape corresponding to that of the separator SEP. For example, a portion of the separation electrode SELT may have a shape extending in the second direction DR2 similar to that of the separator SEP, and the first separation electrode SELT1 and the second separation electrode SELT2 may be spaced apart from each other in the first direction DR1. Accordingly, the first separation electrode SELT1 may be disposed between the (2-1)-th electrode ELT2-1 and the connection electrode CELT, and the second separation electrode SELT2 may be disposed between the connection electrode CELT and the (2-2)-th electrode ELT2-2.

According to an embodiment, the separation electrode SELT may be physically separated from the second electrode ELT2 and the connection electrode CELT. For example, the separation electrode SELT may not be electrically connected to the second electrode ELT2 and the connection electrode CELT.

Accordingly, the connection electrode CELT may form a power supply path 100 between the (2-1)-th electrode ELT2-1 and the (2-2)-th electrode ELT2-2. As a result, the second electrodes ELT2 may receive power supplied through the power supply path 100.

According to an embodiment, when the first separator SEP1 and the second separator SEP2 have heights H that are different from each other, the separation electrode SEL may not be disposed on any one of the first separator SEP1 and/or the second separator SEP2. For example, the first separator SEP1 may have a height less than that of the second separator SEP2. In this case, the connection electrode CELT may be disposed over the separation area SA and an upper surface area of the second separator SEP2. The connection electrode CELT may also be disposed on an area where the second separator SEP2 is disposed, and may be electrically connected to the (2-2)-th electrode ELT2-2. Similarly, the connection electrode CELT may electrically connect the (2-1)-th electrode ELT2-1 and the (2-2)-th electrode ELT2-2 to each other, and because the second electrode ELT2 and the connection electrode CELT may extend over the second separator SEP2 to form a conductive structure, a resistance thereof may be relatively reduced while a connection structure of the cathode electrode is finely formed.

According to an embodiment (e.g., refer to FIGS. 16 and 18), the separator SEP may further include a residual separator RSEP.

The residual separator RSEP may be disposed on the pixel defining layer PDL. The residual separator RSEP may be disposed between the first separator SEP1 and the second separator SEP2. The residual separator RSEP may have a height less than that of the first separator SEP1 and the second separator SEP2.

The residual separator RSEP may be integrally formed with the body portion SEP_B of each of the first separator SEP1 and the second separator SEP2, and may be physically spaced apart from each protrusion portion SEP_T.

For example, the residual separator RSEP may include silicon oxide (SiOx) the same as (e.g., equally to) that of the body portion SEP_B. However, the present disclosure is not limited thereto.

According to an embodiment, the residual separator RSEP may include a material different from that of a layer formed on the uppermost portion of the pixel defining layer PDL. For example, a layer formed on the uppermost portion of the pixel defining layer PDL (e.g., the third pixel defining layer PDL3) may include silicon nitride (SiNx), and the residual separator RSEP may include silicon oxide (SiOx) differently therefrom.

According to an embodiment, when the residual separator RSEP is formed, a height of a position of a base on which materials to be deposited may be increased in an area between the first separator SEP1 and the second separator SEP2. In this case, the materials to be deposited may form an intended structure in the area between the first separator SEP1 and the second separator SEP2. For example, when the residual separator RSEP is formed, the connection electrode CELT may be more suitably deposited between the first separator SEP1 and the second separator SEP2. In addition, referring to FIG. 18, when the residual separator RSEP is formed, the connection electrode CELT and the (2-2)-th electrode ELT2-2 may be connected to each other with higher reliability.

According to an embodiment, the connection electrode CELT may include one or more electrode bending portions EBA. For example, the connection electrode CELT may include two electrode bending portions EBA. However, the present disclosure is not necessarily limited thereto, and the number of electrode bending portions EBA may be variously modified as needed or desired.

According to an embodiment, the second electrode ELT2, the separation electrode SELT, and the connection electrode CELT may be formed in the same process. For example, a conductive layer for forming the second electrode ELT2, the separation electrode SELT, and the connection electrode CELT may be deposited, and an area where the second electrode ELT2, the separation electrode SELT, and the connection electrode CELT are patterned may be determined by the separator SEP.

For example, the separator SEP may include a tip structure protruding in a third direction DR3 (e.g., the thickness direction of the base layer BSL or a normal direction of a plane on which the base layer BSL is disposed), and protruding in a direction (e.g., a planar direction of the base layer BSL or a direction in which the plane on which the base layer BSL is disposed extends) different from the third direction DR3. In this case, when a conductive layer is deposited, the conductive layers deposited at ends of the separator SEP may be physically separated from each other. Accordingly, in a plan view, at one end of the separator SEP, the second electrode ELT2 and the separation electrode SELT may be spaced apart from each other. At another end of the separator SEP, the connection electrode CELT and the separation electrode SELT may be spaced apart from each other. Accordingly, the second electrodes ELT2 may be electrically connected to each other through the power supply path 100 formed by the connection electrode CELT.

According to an embodiment, the first electrode ELT1 may include the (1-1)-th electrode ELT1-1 included in the first sub-pixel SPX1, and the (1-2)-th electrode ELT1-2 included in the second sub-pixel SPX2. According to an embodiment, the pixel defining layer PDL may be disposed between the (1-1)-th electrode ELT1-1 and the (1-2)-th electrode ELT1-2. Accordingly, each of the sub-pixels SPX may be configured to receive anode signals different from each other. For example, the (1-1)-th electrode ELT1-1 may be electrically connected to the first light emitting unit EL1. The (1-2)-th electrode ELT1-2 may be electrically connected to the second light emitting unit EL2.

According to an embodiment, the pixel defining layer PDL may have a separation length L1. The separation length L1 may be 1 μm to 1.5 μm. In this case, the light emitting units EL of each of the sub-pixels SPX may be more adjacent (e.g., closer) to each other, and necessity for preventing a risk of electrical signals being crossed between the light emitting units EL may exist.

According to an embodiment, the first separator SEP1 and the second separator SEP2 may be spaced apart by a separation length L2. The separation length L2 may be 0.3 μm to 0.4 μm. The separation length L2 may be less than the separation length L1.

According to an embodiment, the display device DD may further include the light emitting connection part CEL. The light emitting connection part CEL may be disposed in the display area DA. The light emitting unit EL and the light emitting connection part CEL may be formed in the same process. For example, the light emitting unit EL and the light emitting connection part CEL may be deposited in the same process, and thus, may include the same material as each other. The light emitting unit EL and the light emitting connection CEL may be integrally formed with each other.

The light emitting connection part CEL may electrically connect the light emitting units EL that are adjacent to each other. The light emitting units EL of each of the sub-pixels SPX may be electrically connected by the light emitting connection part CEL. For example, the light emitting connection part CEL may connect the light emitting unit EL disposed on one side of the light emitting connection part CEL and the light emitting unit EL disposed on another side of the light emitting connection part CEL to each other. For example, the first light emitting unit EL1 and the second light emitting unit EL2 may be electrically connected to each other by the light emitting connection part CEL.

The light emitting connection part CEL may be disposed in the separation area SA. The light emitting connection part CEL may be patterned in an area where the separator SEP is not disposed. Accordingly, the light emitting connection part CEL disposed in the separation area SA may electrically connect the first light emitting unit EL1 and the second light emitting unit EL2 to each other.

According to an embodiment, the display device DD may further include the light emitting separation part SEL. The light emitting separation part SEL may be disposed on the separator SEP. The light emitting separation part SEL may be disposed between the separator SEP and the separation electrode SELT. For example, the first light emitting separation part SEL1 may be disposed on the first separator SEP1. The second light emitting separation part SEL2 may be disposed on the second separator SEP2.

According to an embodiment, the light emitting separation part SEL may have a shape corresponding to that of the separator SEP. For example, a portion of the light emitting separation part SEL may have a shape extending in the second direction DR2 similar to that of the separator SEP, and the first light emitting separation part SEL1 and the second light emitting separation part SEL2 may be spaced apart from each other in the first direction DR1. Accordingly, the first light emitting separation part SEL1 may be disposed between the first light emitting unit EL1 and the light emitting connection part CEL, and the second light emitting unit SEL2 may be disposed between the second light emitting unit EL2 and the light emitting connection part CEL.

According to an embodiment, the light emitting separation part SEL may be physically separated from the light emitting unit EL and the light emitting connection part CEL. For example, the light emitting separation part SEL may not be electrically connected to the light emitting unit EL and the light emitting connection part CEL.

Accordingly, the light emitting connection part CEL may form a light emitting connection path 200 between the first light emitting unit EL1 and the second light emitting unit EL2.

According to an embodiment, the light emitting connection part CEL may include one or more light emitting bending portions EMBA. For example, the light emitting connection part CEL may include two light emitting bending portions EMBA. However, the present disclosure is not limited thereto, and the number of light emitting bending portions EMBA may be variously modified as needed or desired.

According to an embodiment, the light emitting units EL may be electrically connected to each other. For example, the first light emitting unit EL1, the second light emitting unit EL2, and the third light emitting unit EL3 may be electrically connected to each other.

According to an embodiment, the light emitting unit EL, the light emitting separation part SEL, and the light emitting connection part CEL may be formed in the same process. For example, layers for forming the light emitting unit EL, the light emitting separation part SEL, and the light emitting connection part CEL may be deposited, and an area where the light emitting unit EL, the light emitting separation part SEL, and the light emitting connection part CEL are patterned may be determined by the separator SEP.

For example, as described above, the separator SEP may include the tip structure. In this case, when the layers including the light emitting layer EML are deposited, the layers deposited at the ends of the separator SEP may be physically separated from each other. Accordingly, in a plan view, at one end of the separator SEP, the light emitting unit EL and the light emitting separation part SEL may be spaced apart from each other. At another end of the separator SEP, the light emitting connection part CEL and the light emitting separation part SEL may be spaced apart from each other. Accordingly, the light emitting units EL may be electrically connected to each other through the light emitting connection path 200 formed by the light emitting connection part CEL.

According to an embodiment, the light emitting connection path 200 may include a first path 220, a second path 240, and a third path 260. According to an embodiment, the first path 220, the second path 240, and the third path 260 may be connected to each other. The first path 220 and the second path 240 may extend in directions different from each other in a plan view. The second path 240 and the third path 260 may extend in directions different from each other in a plan view.

According to an embodiment, the first path 220 may be formed between the second intermediate connection separator MSEP2 and the first separator SEP1. The second path 240 may be formed between the first separator SEP1 and the second separator SEP2. The third path 260 may be formed between the second separator SEP2 and the first intermediate connection separator MSEP1.

According to an embodiment, because the light emitting connection path 200 is formed, a possibility that electrical information is crossed between adjacent light emitting units EL may be reduced. For example, because the separator SEP forms the multiple separating structures, the light emitting connection part CEL may form one or more light emitting bending portions EMBA, and the light emitting connection path 200 may be defined to be further extended. For example, a length of the light emitting connection path 200 may be greater than a distance at which the light emitting units EL are spaced apart from each other. In this case, the light emitting connection path 200 may be formed so that a path of a distance greater than the distance at which the light emitting units EL adjacent to each other are spaced apart from each other is defined.

Experimentally, when an electric path is defined so as to be excessively adjacent between the light emitting units EL, carriers (e.g., electrons or holes) formed in each of the light emitting units EL may move to another. For example, because the first light emitting unit EL1 and the second light emitting unit EL2 form the sub-pixels SPX different from each other, a risk that a carrier of the first light emitting unit EL1 penetrates the second light emitting unit EL2 may be desired to be reduced, and a risk that a carrier of the second light emitting unit EL2 penetrates the first light emitting unit EL1 may be desired to be reduced.

According to an embodiment, because the light emitting connection path 200 forms one or more light emitting bending portions EMBA, complexity of an electrical path may be increased, and thus, the light emitting connection path 200 in which an electrical connection route is expanded may be defined.

In this case, a risk that the carrier moves between the adjacent light emitting units EL, and thus, electric signals are crossed, may be reduced, color reproducibility of the sub-pixels SPX may be improved, and reliability of the electric signals may be reconsidered.

The foregoing is illustrative of some embodiments of the present disclosure, and is not to be construed as limiting thereof. Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display device comprising:

sub-pixels on a base layer, each of the sub-pixels comprising a light emitting element comprising:

a first electrode;

a second electrode; and a light emitting structure electrically connected between the first electrode and the second electrode; and a separator protruding in a thickness direction of the base layer between the sub-pixels, and comprising separator structures spaced from each other in a plan view to define a separation area, wherein the separation area comprises one or more bending areas between the sub-pixels.

2. The display device according to claim 1, further comprising a light emitting connection part including the same material as that of the light emitting structure, and comprising one or more light emitting bending portions, wherein the first electrode comprises a (1-1)-th electrode and a (1-2)-th electrode, wherein the light emitting structure comprises a first light emitting structure electrically connected to the (1-1)-th electrode, and a second light emitting structure electrically connected to the (1-2)-th electrode, wherein the first light emitting structure and the second light emitting structure are electrically connected to each other by the light emitting connection part, wherein the separator surrounds at least a portion of each of the first light emitting structure, the second light emitting structure, and the light emitting connection part, and wherein the separator comprises a first separator and a second separator located between the first light emitting structure and the second light emitting structure, and spaced from each other in a direction in which the first light emitting structure and the second light emitting structure are spaced from each other.

3. The display device according to claim 2, wherein the separator further comprises an intermediate connection separator connected to at least one of the first separator or the second separator, and wherein at least a portion of each of the first separator and the second separator extends in a direction different from the direction in which the first light emitting structure and the second light emitting structure are spaced from each other.

4. The display device according to claim 3, wherein the intermediate connection separator comprises a first intermediate connection separator and a second intermediate connection separator, wherein the first intermediate connection separator is spaced from the second separator, and directly connected to the first separator, and wherein the second intermediate connection separator is spaced from the first separator, and directly connected to the second separator.

5. The display device according to claim 2, further comprising a connection electrode including the same material as that of the second electrode, wherein the second electrode comprises a (2-1)-th electrode and a (2-2)-th electrode, and wherein the connection electrode electrically connects the (2-1)-th electrode and the (2-2)-th electrode to each other, and comprises one or more electrode bending portions.

6. The display device according to claim 4, wherein the light emitting connection part defines a light emitting connection path electrically connected between the first light emitting structure and the second light emitting structure.

7. The display device according to claim 6, wherein the light emitting connection path comprises:

a first path between the second intermediate connection separator and the first separator;

a second path between the first separator and the second separator; and a third path between the second separator and the first intermediate connection separator.

8. The display device according to claim 7, wherein the sub-pixels comprise a first sub-pixel configured to emit a first color, a second sub-pixel configured to emit a second color, and a third sub-pixel configured to emit a third color, wherein the first light emitting structure is in the first sub-pixel, wherein the second light emitting structure is in the second sub-pixel, wherein the light emitting structure further comprises a third light emitting structure in the third sub-pixel, wherein the separator comprises a (1-1)-th adjacent separator and a (1-2)-th adjacent separator located between the first light emitting structure and the third light emitting structure, and spaced from each other in a direction in which the first light emitting structure and the third light emitting structure are spaced from each other, and wherein the second intermediate connection separator is adjacent to the first sub-pixel, the second sub-pixel, and the third sub-pixel in a plan view, spaced from the (1-1)-th adjacent separator, and directly connected to the (1-2)-th adjacent separator.

9. The display device according to claim 8, wherein the separator comprises a (2-1)-th separator and a (2-2)-th separator located between the second light emitting structure and the third light emitting structure, and spaced from each other in a direction in which the second light emitting structure and the third light emitting structure are spaced from each other, and wherein the second intermediate connection separator is spaced from the (2-1)-th separator, and directly connected to the (2-2)-th separator.

10. The display device according to claim 1, wherein the sub-pixels have a quadrangular shape or a hexagonal shape in a plan view.

11. The display device according to claim 8, wherein the first light emitting structure, the second light emitting structure, and the third light emitting structure are electrically connected to each other, and wherein a length of the light emitting connection path is greater than a distance in which the first light emitting structure and the second light emitting structure are spaced from each other.

12. The display device according to claim 5, further comprising:

a separation electrode including the same material as that of the second electrode, and comprising a first separation electrode and a second separation electrode; and a light emitting separation part including the same material as that of the light emitting structure, and comprising a first light emitting separation part and a second light emitting separation part, wherein the first separation electrode is located between the (2-1)-th electrode and the connection electrode, wherein the second separation electrode is located between the connection electrode and the (2-2)-th electrode, wherein the first light emitting separation part is located between the first light emitting structure and the light emitting connection part, and wherein the second light emitting separation part is located between the light emitting connection part and the second light emitting structure.

13. The display device according to claim 12, wherein the first light emitting separation part is located between the first separator and the first separation electrode, and the second light emitting separation part is located between the second separator and the second separation electrode.

14. The display device according to claim 2, wherein the separator further comprises a third separator spaced from the first separator and the second separator along a direction in which the first separator and the second separator are spaced from each other.

15. The display device according to claim 14, wherein a height of the separator is 1000 Å to 4000 Å, and wherein the first separator and the second separator are spaced from each other by 0.3 μm to 0.4 μm.

16. The display device according to claim 2, wherein the first separator and the second separator have different heights from each other.

17. The display device according to claim 2, further comprising a pixel defining layer between the (1-1)-th electrode and the (1-2)-th electrode, wherein the separator is on the pixel defining layer, and wherein the light emitting structure comprises a hole injection layer, a hole transport layer, a light emitting layer, an electron transport layer, and an electron injection layer.

18. The display device according to claim 17, wherein each of the first separator and the second separator comprises a body portion, and a protrusion portion on the body portion, wherein the separator further comprises a residual separator on the pixel defining layer, and located between the first separator and the second separator, wherein the residual separator has a height lower than that of the first separator and the second separator, and wherein the residual separator includes the same material as that of the body portion.

19. The display device according to claim 18, wherein the residual separator includes a material different from that of a layer located at an uppermost portion of the pixel defining layer.

20. The display device according to claim 1, further comprising:

a display area, and a non-display area surrounding at least a portion of the display area;

a pixel-circuit layer on the base layer, and comprising a pixel circuit electrically connected to the first electrode;

a first power line on the base layer, and electrically connected to the pixel circuit; and a second power line on the base layer, and in the non-display area, the second power line being electrically connected to the second electrode, wherein the second electrode and the second power line are electrically connected to each other in an area adjacent to the display area and the non-display area.

21. A display device comprising:

sub-pixels on a base layer, and comprising a first sub-pixel and a second sub-pixel; and a connection electrode on the base layer, wherein each of the sub-pixels comprises a light emitting element on the base layer, the light emitting element comprising a first electrode, a second electrode, and a light emitting structure electrically connected between the first electrode and the second electrode, wherein the second electrode comprises a (2-1)-th electrode in the first sub-pixel, and a (2-2)-th electrode in the second sub-pixel, and wherein the connection electrode is integral with the (2-1)-th electrode and the (2-2)-th electrode, electrically connects the (2-1)-th electrode and the (2-2)-th electrode to each other, and comprises one or more electrode bending portions.

22. A display device comprising:

sub-pixels on a base layer, and comprising a first sub-pixel and a second sub-pixel; and a light emitting connection part on the base layer, wherein each of the sub-pixels comprises a light emitting element on the base layer, the light emitting element comprising a first electrode, a second electrode, and a light emitting structure electrically connected between the first electrode and the second electrode, wherein the light emitting structure comprises a first light emitting structure in the first sub-pixel, and a second light emitting structure in the second sub-pixel, and wherein the light emitting connection part is integral with the first light emitting structure and the second light emitting structure to connect the first light emitting structure and the second light emitting structure to each other, and comprises one or more light emitting bending portions.

* * * * *